(12) United States Patent
Maeno et al.

(10) Patent No.: US 8,900,701 B2
(45) Date of Patent: *Dec. 2, 2014

(54) FIBROUS COLUMNAR STRUCTURE AGGREGATE AND PRESSURE-SENSITIVE ADHESIVE MEMBER USING THE AGGREGATE

(75) Inventors: Youhei Maeno, Ibaraki (JP); Yoshikazu Nakayama, Suita (JP); Kaori Hirahara, Suita (JP)

(73) Assignee: Nitto Denko Corporation, Osaka (JP)

( * ) Notice: Subject to any disclaimer, the term of this patent is extended or adjusted under 35 U.S.C. 154(b) by 30 days.

This patent is subject to a terminal disclaimer.

(21) Appl. No.: 12/988,268

(22) PCT Filed: Mar. 31, 2009

(86) PCT No.: PCT/JP2009/056640
§ 371 (c)(1),
(2), (4) Date: Nov. 5, 2010

(87) PCT Pub. No.: WO2009/128342
PCT Pub. Date: Oct. 22, 2009

(65) Prior Publication Data
US 2011/0039095 A1 Feb. 17, 2011

(30) Foreign Application Priority Data

Apr. 16, 2008 (JP) ................................. 2008-106351
Jul. 1, 2008 (JP) ................................. 2008-172036

(51) Int. Cl.
*D02G 3/00* (2006.01)
*B81B 1/00* (2006.01)
*C09J 7/00* (2006.01)

(52) U.S. Cl.
CPC ... *B81B 1/00* (2013.01); *C09J 7/00* (2013.01); *C09J 2201/626* (2013.01); *Y10S 977/742* (2013.01); *Y10S 977/752* (2013.01)

USPC .......... 428/364; 428/332; 428/397; 428/398; 977/742; 977/752

(58) Field of Classification Search
USPC ........... 428/332, 364, 397, 398; 977/742, 752
See application file for complete search history.

(56) References Cited

U.S. PATENT DOCUMENTS

| 6,737,160 B1 | 5/2004 | Full et al. |
| 2004/0071870 A1 | 4/2004 | Knowles et al. |

(Continued)

FOREIGN PATENT DOCUMENTS

| CN | 1903715 A | 1/2007 |
| CN | 101094901 A | 12/2007 |

(Continued)

OTHER PUBLICATIONS

Chinese Office Action issued in Application No. 200980113567.7 dated Jul. 11, 2012.

*Primary Examiner* — Matthew Matzek
(74) *Attorney, Agent, or Firm* — Sughrue Mion, PLLC

(57) ABSTRACT

A fibrous columnar structure aggregate having excellent mechanical properties, a high specific surface area, excellent heat resistance, excellent pressure-sensitive adhesive properties under temperature conditions ranging from room temperature to a high temperature, and such pressure-sensitive adhesive property that its adhesive strength for adherends different from each other in surface free energy does not change (the aggregate is free of adherend selectivity). The fibrous columnar structure aggregate (1) includes fibrous columnar structures having a plurality of diameters, in which the distribution width of the diameter distribution of the fibrous columnar structures having the plurality of diameters is 10 nm or more, and the relative frequency of the mode of the diameter distribution is 30% or less.

10 Claims, 11 Drawing Sheets

(56) References Cited

U.S. PATENT DOCUMENTS

2004/0241080 A1* 12/2004 Nagy et al. ................. 423/447.3
2006/0068195 A1   3/2006 Majumdar et al.
2009/0035209 A1   2/2009 Kondo et al.
2009/0127712 A1   5/2009 Wyland
2009/0200912 A1*  8/2009 Ren et al. ...................... 313/311
2010/0003809 A1   1/2010 Huang

FOREIGN PATENT DOCUMENTS

| JP | 2004-217511 A | 8/2004 |
| JP | 2004-300631 A | 10/2004 |
| JP | 2008-055710 A | 3/2008 |
| WO | WO 2007047949 A2 * | 4/2007 |
| WO | 2007/116434 A | 10/2007 |

* cited by examiner

FIBROUS COLUMNAR STRUCTURE AGGREGATE AND PRESSURE-SENSITIVE ADHESIVE MEMBER USING THE AGGREGATE

CROSS REFERENCE TO RELATED APPLICATIONS

This application is a National Stage of International Application No. PCT/JP2009/056640, filed on Mar. 31, 2009, which claims priority from Japanese Patent Application Nos. 2008-106351 and 2008-172036, filed on Apr. 16, 2008 and Jul. 1, 2008 respectively, the contents of all of which are incorporated herein by reference in their entirety.

TECHNICAL FIELD

The present invention relates to a fibrous columnar structure aggregate and an application of the aggregate, and more specifically, to a fibrous columnar structure aggregate that brings together excellent mechanical properties and a high specific surface area, and a pressure-sensitive adhesive member using the aggregate.

BACKGROUND ART

Pressure-sensitive adhesives each having various properties have been used in industrial applications. However, materials for most of the adhesives are viscoelastic bodies each subjected to flexible bulk designing. Because of its low modulus, a pressure-sensitive adhesive formed of a viscoelastic body becomes wet to conform to an adherend, thereby expressing its adhesive strength.

Meanwhile, columnar fibrous structures each having a fine diameter as novel pressure-sensitive adhesives have been known to show adhesive properties. It has been elucidated that the structures each follow the surface unevenness of an adherend to express its adhesive strength by virtue of a van der Waals force because the structures each have a diameter of the order of $10^{-6}$ m to $10^{-9}$ m.

A method of using the columnar fibrous structures each having a fine diameter in a pressure-sensitive adhesive is, for example, (1) a technology involving filling a filter having a columnar pore with a resin and removing the filter after the filling to provide the pressure-sensitive adhesive or (2) a technology involving growing the columnar fibrous structures each having a fine diameter on an Si substrate by chemical vapor deposition (CVD) to provide the pressure-sensitive adhesive (Patent Documents 1 to 3).

However, the above-mentioned technology (1) involves the following problem. That is, a filter that can be used is limited, and hence a columnar fibrous structure that can be produced has an insufficient length and a low adhesive strength.

In addition, in the above-mentioned technology (2), the adhesive strength of any one of the columnar fibrous structures is high, and obtains a value equivalent to that of a general-purpose pressure-sensitive adhesive in terms of an adhesive strength per unit area. However, the technology involves the following problem. That is, when evaluation for adhesive strength is performed in an adhesion area of about 1 $cm^2$ in accordance with an adhesion evaluation method for a pressure-sensitive adhesive which has been generally performed (Patent Document 3), the shear adhesive strength of the columnar fibrous structures is low, and is weak as compared with that of a conventional general-purpose pressure-sensitive adhesive.

In addition, properties requested of pressure-sensitive adhesives vary depending on applications. Of those, heat resistance is needed for a pressure-sensitive adhesive to be used under a high-temperature condition. However, pressure-sensitive adhesives using an acrylic resin, a rubber-based resin, a styrene-butadiene copolymer-based resin, and the like as raw materials serving as general-purpose pressure-sensitive adhesives that have been generally used each involve the following problem. That is, the pressure-sensitive adhesives decompose at temperatures equal to or more than 200° C. because those resins each have a low decomposition temperature. In addition, even a pressure-sensitive adhesive using a raw material except such resins as described above involves a large change in modulus under a high-temperature condition as compared with its modulus at room temperature. Accordingly, such a problem that the adhesive strength of the pressure-sensitive adhesive under the condition pales beside that at room temperature, or a contamination problem due to an adhesive residue or the like arises.

In addition, a pressure-sensitive adhesive to be repeatedly bonded to or peeled from a plurality of adherends is requested to be free of adherend selectivity. However, the pressure-sensitive adhesives using an acrylic resin, a rubber-based resin, a styrene-butadiene copolymer-based resin, and the like as raw materials serving as general-purpose pressure-sensitive adhesives that have been generally used each involve the following problem. That is, the adhesive strength of any such resin depends on the surface free energy of an adherend, and hence the pressure-sensitive adhesives each show adhesive strengths largely different from each other for adherends largely different from each other in surface free energy.

Patent Document 1: U.S. Pat. No. 6,737,160 A
Patent Document 2: US 2004/0071870 A1
Patent Document 3: US 2006/0068195 A1

DISCLOSURE OF THE INVENTION

Problems to be Solved by the Invention

An object of the present invention is to provide a fibrous columnar structure aggregate having excellent mechanical properties, a high specific surface area, and excellent pressure-sensitive adhesive property. Another object of the present invention is to provide a fibrous columnar structure aggregate having excellent heat resistance, a high specific surface area, and excellent pressure-sensitive adhesive properties under temperature conditions ranging from room temperature to a high temperature. Another object of the present invention is to provide a fibrous columnar structure aggregate having a high specific surface area and such pressure-sensitive adhesive property that its adhesive strength for adherends different from each other in surface free energy does not change (the aggregate is free of adherend selectivity). Another object of the present invention is to provide a pressure-sensitive adhesive member using any such fibrous columnar structure aggregate.

Means for Solving the Problems

A fibrous columnar structure aggregate (1) of the present invention includes fibrous columnar structures having a plurality of diameters, in which the distribution width of the diameter distribution of the fibrous columnar structures having the plurality of diameters is 10 nm or more, and the relative frequency of the mode of the diameter distribution is 30% or less.

In a preferred embodiment, the above-mentioned mode of the diameter distribution is present within the range of 5 nm to 15 nm.

In a preferred embodiment, the above-mentioned fibrous columnar structures having the plurality of diameters are aligned in a lengthwise direction.

In a preferred embodiment, a shear adhesive strength for a glass surface at room temperature is 15 N/cm$^2$ or more.

In a preferred embodiment, the fibrous columnar structure aggregate (1) of the present invention further includes a base material to which one end of each of the above-mentioned fibrous columnar structures is fixed.

According to another aspect of the present invention, there is provided a fibrous columnar structure aggregate (2) as a carbon nanotube aggregate.

The fibrous columnar structure aggregate (2) as a carbon nanotube aggregate of the present invention includes a plurality of fibrous columnar structures, in which:

the fibrous columnar structures are carbon nanotubes, and the carbon nanotubes are carbon nanotubes each having a plurality of walls; and the distribution width of the wall number distribution of the carbon nanotubes each having the plurality of walls is 10 walls or more, and the relative frequency of the mode of the wall number distribution is 25% or less.

In a preferred embodiment, the above-mentioned mode of the wall number distribution is present within the wall number range of 2 to 10.

In a preferred embodiment, the above-mentioned carbon nanotubes each having the plurality of walls include carbon nanotubes each having a length of 300 μm or more.

In a preferred embodiment, the above-mentioned carbon nanotubes each having the plurality of walls are aligned in a lengthwise direction.

In a preferred embodiment, a shear adhesive strength for a glass surface at room temperature is 15 N/cm$^2$ or more.

In a preferred embodiment, the fibrous columnar structure aggregate (2) of the present invention further includes a base material to which one end of each of the above-mentioned carbon nanotubes is fixed.

According to still another aspect of the present invention, there is provided a fibrous columnar structure aggregate (3) as a carbon nanotube aggregate.

The fibrous columnar structure aggregate (3) as a carbon nanotube aggregate of the present invention includes a plurality of fibrous columnar structures, in which:

the fibrous columnar structures are carbon nanotubes, and the carbon nanotubes are carbon nanotubes each having a plurality of walls;

the distribution width of the wall number distribution of the carbon nanotubes each having the plurality of walls is 10 walls or more, and the relative frequency of the mode of the wall number distribution is 25% or less; and a shear adhesive strength for a glass surface under a 250° C. atmosphere is 0.8 to 1.2 times as high as a shear adhesive strength for the glass surface at room temperature.

In a preferred embodiment, the above-mentioned carbon nanotubes each having the plurality of walls include carbon nanotubes each having a length of 300 μm or more.

In a preferred embodiment, the above-mentioned mode of the wall number distribution is present within the wall number range of 1 to 10.

In a preferred embodiment, the above-mentioned carbon nanotubes each having the plurality of walls are aligned in a lengthwise direction.

In a preferred embodiment, the shear adhesive strength for the glass surface at room temperature is 15 N/cm$^2$ or more.

In a preferred embodiment, the fibrous columnar structure aggregate (3) of the present invention further includes a base material to which one end of each of the above-mentioned carbon nanotubes is fixed.

According to still another aspect of the present invention, there is provided a fibrous columnar structure aggregate (4) as a carbon nanotube aggregate.

The fibrous columnar structure aggregate (4) as a carbon nanotube aggregate of the present invention includes a plurality of fibrous columnar structures, in which:

the fibrous columnar structures are carbon nanotubes, and the carbon nanotubes are carbon nanotubes each having a plurality of walls;

the distribution width of the wall number distribution of the carbon nanotubes each having the plurality of walls is 10 walls or more, and the relative frequency of the mode of the wall number distribution is 25% or less; and when a shear adhesive strength at room temperature for an adherend having a surface free energy a is represented by A and a shear adhesive strength at room temperature for an adherend having a surface free energy b differing from the surface free energy a by 25 mJ/m$^2$ or more is represented by B (provided that a>b), a value for a ratio B/A is 0.8 to 1.2.

In a preferred embodiment, the above-mentioned carbon nanotubes each having the plurality of walls include carbon nanotubes each having a length of 300 μm or more.

In a preferred embodiment, the above-mentioned mode of the wall number distribution is present within the wall number range of 1 to 10.

In a preferred embodiment, the above-mentioned carbon nanotubes each having the plurality of walls are aligned in a lengthwise direction.

In a preferred embodiment, a shear adhesive strength for a glass surface at room temperature is 15 N/cm$^2$ or more.

In a preferred embodiment, the fibrous columnar structure aggregate (4) of the present invention further includes a base material to which one end of each of the above-mentioned carbon nanotubes is fixed.

According to still another aspect of the present invention, there is provided a pressure-sensitive adhesive member. The pressure-sensitive adhesive member of the present invention uses the fibrous columnar structure aggregate of the present invention.

Effects of the Invention

According to the present invention, there can be provided a fibrous columnar structure aggregate having excellent mechanical properties, a high specific surface area, and excellent pressure-sensitive adhesive property. In addition, there can be provided a fibrous columnar structure aggregate having excellent heat resistance, a high specific surface area, and excellent pressure-sensitive adhesive properties under temperature conditions ranging from room temperature to a high temperature. In addition, there can be provided a fibrous columnar structure aggregate having a high specific surface area and such pressure-sensitive adhesive property that its adhesive strength for adherends different from each other in surface free energy does not change (the aggregate is free of adherend selectivity). Further, there can be provided a pressure-sensitive adhesive member using any such fibrous columnar structure aggregate. In addition, the fibrous columnar structure aggregate of the present invention is excellent in heat-resistant retaining strength. For example, even after the aggregate has been crimped onto a slide glass and placed under a high temperature of, say, 350° C. for 2 hours, the aggregate hardly shifts.

DESCRIPTION OF SYMBOLS 10 fibrous columnar structure aggregate
1 base material
2 fibrous columnar structure

BEST MODE FOR CARRYING OUT THE INVENTION

Figure 1:
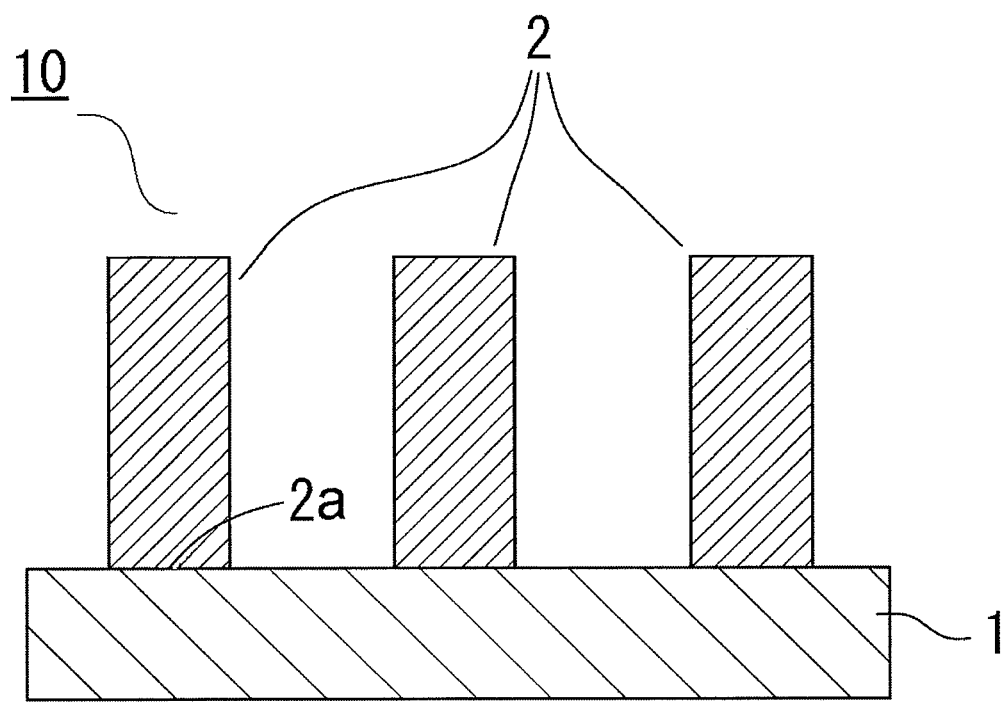
FIG. 1 is a schematic sectional view of a fibrous columnar structure aggregate in a preferred embodiment of the present invention.

FIG. 1 illustrates a schematic sectional view of a fibrous columnar structure aggregate in a preferred embodiment of the present invention (the view is not precisely illustrated to scale in order that each constituent portion may be clearly illustrated). A fibrous columnar structure aggregate 10 includes a base material 1 and fibrous columnar structures 2. One end 2a of each of the fibrous columnar structures is fixed to the base material 1. The fibrous columnar structures 2 are aligned in a lengthwise direction L. The fibrous columnar structures 2 are preferably aligned in a direction substantially perpendicular to the base material 1. Even when the fibrous columnar structure aggregate does not include any base material unlike the illustrated example, the fibrous columnar structures can exist as an aggregate by virtue of a mutual van der Waals force. Accordingly, the fibrous columnar structure aggregate of the present invention may be an aggregate that does not include any base material.

[Fibrous Columnar Structure Aggregate (1)]

A fibrous columnar structure aggregate (1) of the present invention includes fibrous columnar structures having a plurality of diameters, in which the distribution width of the diameter distribution of the fibrous columnar structures having the plurality of diameters is 10 nm or more, and the relative frequency of the mode of the diameter distribution is 30% or less.

Any appropriate material can be adopted as a material for each of the above-mentioned fibrous columnar structures. Examples of the material include: metals such as aluminum and iron; inorganic materials such as silicon; carbon materials such as a carbon nanofiber and a carbon nanotube; and high-modulus resins such as an engineering plastic and a super engineering plastic. Specific examples of the resins include a polyimide, a polyethylene, a polypropylene, a polyethylene terephthalate, an acetylcellulose, a polycarbonate, and a polyamide. Any appropriate physical property can be adopted as each of the various physical properties of any such resin such as a molecular weight to such an extent that an object of the present invention can be achieved.

The distribution width of the diameter distribution of the fibrous columnar structures is 10 nm or more, preferably 10 to 30 nm, more preferably 10 to 25 nm, or still more preferably 10 to 20 nm.

The "distribution width" of the diameter distribution of the fibrous columnar structures described above refers to a difference between the maximum and minimum of the diameters of the fibrous columnar structures. In the present invention, the fibrous columnar structures can bring together excellent mechanical properties and a high specific surface area, and furthermore, the fibrous columnar structures can be a fibrous columnar structure aggregate showing excellent pressure-sensitive adhesive property when the distribution width of the diameter distribution of the fibrous columnar structures falls within the above-mentioned range. It should be noted that the diameters and diameter distribution of the fibrous columnar structures in the present invention have only to be measured with any appropriate apparatus. The measurement is preferably performed with a scanning electron microscope (SEM) or a transmission electron microscope (TEM). For example, at least ten, or preferably twenty or more, fibrous columnar structures out of the fibrous columnar structure aggregate have only to be evaluated for their diameters and diameter distribution by measurement with the SEM or TEM.

The maximum of the diameters of the fibrous columnar structures described above is preferably 5 to 30 nm, more preferably 10 to 30 nm, still more preferably 15 to 30 nm, or particularly preferably 15 to 25 nm. The minimum of the diameters of the fibrous columnar structures described above is preferably 1 to 15 nm, or more preferably 5 to 15 nm. In the present invention, the fibrous columnar structures can bring together additionally excellent mechanical properties and a high specific surface area, and furthermore, the fibrous columnar structures can be a fibrous columnar structure aggregate showing additionally excellent pressure-sensitive adhesive property when the maximum and minimum of the diameters of the fibrous columnar structures fall within the above-mentioned ranges.

The relative frequency of the mode of the diameter distribution described above is 30% or less, preferably 1 to 25%, more preferably 5 to 25%, still more preferably 10 to 25%, or particularly preferably 15 to 25%. In the present invention, the fibrous columnar structures can bring together excellent mechanical properties and a high specific surface area, and furthermore, the fibrous columnar structures can be a fibrous columnar structure aggregate showing excellent pressure-sensitive adhesive property when the relative frequency of the mode of the diameter distribution falls within the above-mentioned range.

The mode of the diameter distribution described above is present within the diameter range of preferably 5 nm to 15 nm, or more preferably 5 nm to 10 nm. In the present invention, the fibrous columnar structures can bring together excellent mechanical properties and a high specific surface area, and furthermore, the fibrous columnar structures can be a fibrous columnar structure aggregate showing excellent pressure-sensitive adhesive property when the mode of the diameter distribution falls within the above-mentioned range.

With regard to the shape of each of the above-mentioned fibrous columnar structures, the lateral section of the structure has only to have any appropriate shape. The lateral section is of, for example, a substantially circular shape, an elliptical shape, or an n-gonal shape (where n represents an integer of 3 or more). In addition, the above-mentioned fibrous columnar structures may be hollow, or may be filled materials.

The length of each of the above-mentioned fibrous columnar structures can be set to any appropriate length. The length of each of the fibrous columnar structures is preferably 300 μm or more, more preferably 300 to 10,000 μm, still more preferably 300 to 1000 μm, or particularly preferably 300 to 900 μm. In the present invention, the fibrous columnar structures can bring together additionally excellent mechanical properties and a high specific surface area, and furthermore, the fibrous columnar structures can be a fibrous columnar structure aggregate showing additionally excellent pressure-sensitive adhesive property when the length of each of the fibrous columnar structures falls within the above-mentioned range.

In the fibrous columnar structure aggregate (1) of the present invention, the content of fibrous columnar structures each having a length of 300 μm or more in the above-mentioned fibrous columnar structures is preferably 80 to 100%, more preferably 90 to 100%, still more preferably 95 to 100%, particularly preferably 98 to 100%, or most preferably substantially 100%. The phrase "substantially 100%" as used herein refers to a state in which the content is 100% in a detection limit in a measuring instrument. In the present invention, the above-mentioned fibrous columnar structures can bring together additionally excellent mechanical properties and a high specific surface area, and furthermore, the fibrous columnar structures can be a fibrous columnar structure aggregate showing additionally excellent pressure-sensitive adhesive property when the content of fibrous columnar structures each having a length of 300 μm or more in the fibrous columnar structures falls within the above-mentioned range.

The fibrous columnar structure aggregate (1) of the present invention has a shear adhesive strength for a glass surface at room temperature of preferably 15 N/cm$^2$ or more, more preferably 20 to 500 N/cm$^2$, still more preferably 30 to 100 N/cm$^2$, particularly preferably 30 to 80 N/cm$^2$, or particularly preferably 35 to 50 N/cm$^2$. Here, the term "room temperature" as used in the present invention refers to a temperature condition of 25° C.

The specific surface area and density of the fibrous columnar structures described above can each be set to any appropriate value.

In the fibrous columnar structure aggregate (1) of the present invention, in the case where the fibrous columnar structure aggregate is of carbon nanotubes, and the carbon nanotubes are carbon nanotubes each having a plurality of walls, the distribution width of the wall number distribution of the carbon nanotubes each having the plurality of walls is preferably 10 walls or more, and the relative frequency of the mode of the wall number distribution is preferably 25% or less.

The distribution width of the wall number distribution of the carbon nanotubes each having the plurality of walls described above is more preferably 10 to 30 walls, still more preferably 10 to 25 walls, or particularly preferably 10 to 20 walls.

The "distribution width" of the wall number distribution of the carbon nanotubes each having the plurality of walls described above refers to a difference between the maximum wall number and minimum wall number of the wall numbers of the carbon nanotubes each having the plurality of walls. In the present invention, the carbon nanotubes can bring together excellent mechanical properties and a high specific surface area, and furthermore, the carbon nanotubes can be a carbon nanotube aggregate showing excellent pressure-sensitive adhesive property when the distribution width of the wall number distribution of the carbon nanotubes each having the plurality of walls falls within the above-mentioned range. It should be noted that the wall numbers and wall number distribution of the carbon nanotubes in the present invention have only to be measured with any appropriate apparatus. The measurement is preferably performed with a scanning electron microscope (SEM) or a transmission electron microscope (TEM). For example, at least ten, or preferably twenty or more, carbon nanotubes out of the carbon nanotube aggregate have only to be evaluated for their wall numbers and wall number distribution by measurement with the SEM or TEM.

The above-mentioned maximum wall number is preferably 5 to 30, more preferably 10 to 30, still more preferably 15 to 30, or particularly preferably 15 to 25. The above-mentioned minimum wall number is preferably 1 to 10, or more preferably 1 to 5. In the present invention, the carbon nanotubes can bring together additionally excellent mechanical properties and a high specific surface area, and furthermore, the carbon nanotubes can be a carbon nanotube aggregate showing additionally excellent pressure-sensitive adhesive property when the maximum wall number and minimum wall number of the wall numbers of the carbon nanotubes fall within the above-mentioned ranges.

The relative frequency of the mode of the wall number distribution described above is preferably 1 to 25%, more preferably 5 to 25%, still more preferably 10 to 25%, or particularly preferably 15 to 25%. In the present invention, the carbon nanotubes can bring together excellent mechanical properties and a high specific surface area, and furthermore, the carbon nanotubes can be a carbon nanotube aggregate showing excellent pressure-sensitive adhesive property when the relative frequency of the mode of the wall number distribution falls within the above-mentioned range.

The mode of the wall number distribution described above is present within the wall number range of preferably 2 to 10, or more preferably 3 to 10. In the present invention, the carbon nanotubes can bring together excellent mechanical properties and a high specific surface area, and furthermore, the carbon nanotubes can be a carbon nanotube aggregate showing excellent pressure-sensitive adhesive property when the mode of the wall number distribution falls within the above-mentioned range.

[Fibrous Columnar Structure Aggregate (2): Carbon Nanotube Aggregate]

A fibrous columnar structure aggregate (2) as a carbon nanotube aggregate of the present invention includes a plurality of fibrous columnar structures, in which: the fibrous columnar structures are carbon nanotubes, and the carbon nanotubes are carbon nanotubes each having a plurality of walls; and the distribution width of the wall number distribution of the carbon nanotubes each having the plurality of walls is 10 walls or more, and the relative frequency of the mode of the wall number distribution is 25% or less.

The distribution width of the wall number distribution of the carbon nanotubes each having the plurality of walls described above is 10 walls or more, preferably 10 to 30 walls, more preferably 10 to 25 walls, or still more preferably 10 to 20 walls.

The "distribution width" of the wall number distribution of the carbon nanotubes each having the plurality of walls described above refers to a difference between the maximum wall number and minimum wall number of the wall numbers of the carbon nanotubes each having the plurality of walls. In the present invention, the carbon nanotubes can bring together excellent mechanical properties and a high specific surface area, and furthermore, the carbon nanotubes can be a carbon nanotube aggregate showing excellent pressure-sensitive adhesive property when the distribution width of the wall number distribution of the carbon nanotubes each having the plurality of walls falls within the above-mentioned range. It should be noted that the wall numbers and wall number distribution of the carbon nanotubes in the present invention have only to be measured with any appropriate apparatus. The measurement is preferably performed with a scanning electron microscope (SEM) or a transmission electron microscope (TEM). For example, at least ten, or preferably twenty or more, carbon nanotubes out of the carbon nanotube aggregate have only to be evaluated for their wall numbers and wall number distribution by measurement with the SEM or TEM.

The above-mentioned maximum wall number is preferably 5 to 30, more preferably 10 to 30, still more preferably 15 to 30, or particularly preferably 15 to 25. The above-mentioned minimum wall number is preferably 1 to 10, or more preferably 1 to 5. In the present invention, the carbon nanotubes can bring together additionally excellent mechanical properties and a high specific surface area, and furthermore, the carbon nanotubes can be a carbon nanotube aggregate showing additionally excellent pressure-sensitive adhesive property when the maximum wall number and minimum wall number of the wall numbers of the carbon nanotubes fall within the above-mentioned ranges.

The relative frequency of the mode of the wall number distribution described above is 25% or less, preferably 1 to 25%, more preferably 5 to 25%, still more preferably 10 to 25%, or particularly preferably 15 to 25%. In the present invention, the carbon nanotubes can bring together excellent mechanical properties and a high specific surface area, and furthermore, the carbon nanotubes can be a carbon nanotube aggregate showing excellent pressure-sensitive adhesive property when the relative frequency of the mode of the wall number distribution falls within the above-mentioned range.

The mode of the wall number distribution described above is present within the wall number range of preferably 2 to 10, or more preferably 3 to 10. In the present invention, the carbon nanotubes can bring together excellent mechanical properties and a high specific surface area, and furthermore, the carbon nanotubes can be a carbon nanotube aggregate showing excellent pressure-sensitive adhesive property when the mode of the wall number distribution falls within the above-mentioned range.

With regard to the shape of each of the above-mentioned carbon nanotubes, the lateral section of the nanotube has only to have any appropriate shape. The lateral section is of, for example, a substantially circular shape, an elliptical shape, or an n-gonal shape (where n represents an integer of 3 or more).

The length of each of the above-mentioned carbon nanotubes can be set to any appropriate length. The carbon nanotubes each having the plurality of walls preferably include carbon nanotubes each having a length of 300 µm or more. The length of each of the above-mentioned carbon nanotubes is more preferably 300 to 10,000 µm, still more preferably 300 to 1000 µm, or particularly preferably 300 to 900 µm. In the present invention, the carbon nanotubes can bring together additionally excellent mechanical properties and a high specific surface area, and furthermore, the carbon nanotubes can be a carbon nanotube aggregate showing additionally excellent pressure-sensitive adhesive property when the length of each of the carbon nanotubes falls within the above-mentioned range.

In the fibrous columnar structure aggregate (2) as a carbon nanotube aggregate of the present invention, the content of carbon nanotubes each having a length of 300 µm or more in the above-mentioned carbon nanotubes each having the plurality of walls is preferably 80 to 100%, more preferably 90 to 100%, still more preferably 95 to 100%, particularly preferably 98 to 100%, or most preferably substantially 100%. The phrase "substantially 100%" as used herein refers to a state in which the content is 100% in a detection limit in a measuring instrument. In the fibrous columnar structure aggregate (2) as a carbon nanotube aggregate of the present invention, the above-mentioned carbon nanotubes each having the plurality of walls can bring together additionally excellent mechanical properties and a high specific surface area, and furthermore, the carbon nanotubes can be a carbon nanotube aggregate showing additionally excellent pressure-sensitive adhesive property when the content of carbon nanotubes each having a length of 300 µm or more in the carbon nanotubes falls within the above-mentioned range.

The fibrous columnar structure aggregate (2) as a carbon nanotube aggregate of the present invention has a shear adhesive strength for a glass surface at room temperature of preferably 15 N/cm$^2$ or more, more preferably 20 to 500 N/cm$^2$, still more preferably 30 to 100 N/cm$^2$, particularly preferably 30 to 80 N/cm$^2$, or particularly preferably 35 to 50 N/cm$^2$.

The specific surface area and density of the carbon nanotubes described above can each be set to any appropriate value.

In the fibrous columnar structure aggregate (2) as a carbon nanotube aggregate of the present invention, a shear adhesive strength for a glass surface under a 250° C. atmosphere is preferably 0.8 to 1.2 times, more preferably 0.85 to 1.15 times, or still more preferably 0.9 to 1.1 times as high as a shear adhesive strength for the glass surface at room temperature. When the shear adhesive strength for the glass surface under the 250° C. atmosphere is 0.8 to 1.2 times as high as the shear adhesive strength for the glass surface at room temperature, the fibrous columnar structure aggregate (2) can be provided with excellent heat resistance, and the fibrous columnar structure aggregate (2) can be a carbon nanotube aggregate showing excellent pressure-sensitive adhesive properties under temperature conditions ranging from room temperature to a high temperature.

The fibrous columnar structure aggregate (2) as a carbon nanotube aggregate of the present invention has a value for a ratio B/A of preferably 0.8 to 1.2, more preferably 0.85 to 1.15, or still more preferably 0.9 to 1.1 where A represents a shear adhesive strength for an adherend having a surface free energy a and B represents a shear adhesive strength for an adherend having a surface free energy b differing from the surface free energy a by 25 mJ/m$^2$ or more (provided that a>b). When the value for the ratio B/A is 0.8 to 1.2 where A represents the shear adhesive strength for the adherend having the surface free energy a and B represents the shear adhesive strength for the adherend having the surface free energy b differing from the surface free energy a by 25 mJ/m$^2$ or more (provided that a>b), the fibrous columnar structure aggregate (2) can be a carbon nanotube aggregate having such pressure-sensitive adhesive property that its adhesive strength for adherends different from each other in surface free energy does not change (the aggregate is free of adherend selectivity).

When the fibrous columnar structure aggregate (2) as a carbon nanotube aggregate of the present invention is peeled from a semiconductor wafer after having been crimped and bonded onto the semiconductor wafer, the number of particles each having a size of 0.28 μm or more remaining on the semiconductor wafer is preferably 30 particles/4-inch wafer or less, more preferably 25 particles/4-inch wafer or less, or still more preferably 20 particles/4-inch wafer or less. To be additionally specific, when the fibrous columnar structure aggregate (2) as a carbon nanotube aggregate of the present invention transferred onto a polypropylene resin is peeled at a 180° peel from a 4-inch semiconductor wafer after having been crimped and attached onto the semiconductor wafer with a 5-kg roller, the number of particles each having a size of 0.28 μm or more remaining on the peeled semiconductor wafer is preferably 30 particles/4-inch wafer or less, more preferably 25 particles/4-inch wafer or less, or still more preferably 20 particles/4-inch wafer or less. The fibrous columnar structure aggregate (2) as a carbon nanotube aggregate of the present invention is extremely excellent in anti-contamination property because the number of particles each having a size of 0.28 μm or more remaining on a semiconductor wafer when the aggregate is peeled from the semiconductor wafer after having been crimped and attached onto the semiconductor wafer as described above is preferably small as described above.

It should be noted that the 180° peel when evaluation for the above-mentioned anti-contamination property is performed is measured with a tension and compression tester ("TG-1kN" manufactured by Minebea Co., Ltd.) in conformity with the adhesion (180° peeling method) of JIS C 2107. It should be noted that a test piece is the very fibrous columnar structure aggregate (2) as a carbon nanotube aggregate of the present invention transferred onto the polypropylene resin (crimped and bonded onto the semiconductor wafer), the crimping is performed by reciprocating the 5-kg roller once, and the measurement is performed at a temperature of 23±2° C., a humidity of 65±5% RH, and a peeling speed of 300 mm/min.

When the fibrous columnar structure aggregate (2) as a carbon nanotube aggregate of the present invention is fixed to a base material formed of a polypropylene resin (having a thickness of 30 μm), the value for the 180° peel is preferably 1 N/20 mm or less, more preferably 0.001 to 1 N/20 mm, still more preferably 0.001 to 0.7 N/20 mm, still furthermore preferably 0.001 to 0.5 N/20 mm, or particularly preferably 0.001 to 0.4 N/20 mm. The fibrous columnar structure aggregate (2) as a carbon nanotube aggregate of the present invention is extremely excellent in light-peeling property because the value for the 180° peel when the aggregate is fixed to the base material formed of a polypropylene resin (having a thickness of 30 μm) is preferably small as described above. In the case of an ordinary pressure-sensitive adhesive, the value for the 180° peel is larger than 1 N/20 mm.

It should be noted that the 180° peel when evaluation for the above-mentioned light-peeling property is performed is measured with a tension and compression tester ("TG-1kN" manufactured by Minebea Co., Ltd.) in conformity with the adhesion (180° peeling method) of JIS C 2107. It should be noted that a test piece is the fibrous columnar structure aggregate (2) as a carbon nanotube aggregate of the present invention transferred onto a polypropylene resin having a width of 20 mm, a silicon wafer (bare wafer, P type, manufactured by KST) is used as a test panel, the crimping is performed by reciprocating a 2-kg roller once, and the measurement is performed at a temperature of 23±2° C., a humidity of 65±5% RH, and a peeling speed of 300 mm/min.

[Fibrous Columnar Structure Aggregate (3): Carbon Nanotube Aggregate]

A fibrous columnar structure aggregate (3) as a carbon nanotube aggregate of the present invention includes a plurality of fibrous columnar structures, in which: the fibrous columnar structures are carbon nanotubes, and the carbon nanotubes are carbon nanotubes each having a plurality of walls; the distribution width of the wall number distribution of the carbon nanotubes each having the plurality of walls is 10 walls or more, and the relative frequency of the mode of the wall number distribution is 25% or less; and a shear adhesive strength for a glass surface under a 250° C. atmosphere is 0.8 to 1.2 times as high as a shear adhesive strength for the glass surface at room temperature.

The distribution width of the wall number distribution of the carbon nanotubes each having the plurality of walls described above is preferably 10 to 30 walls, more preferably 10 to 25 walls, or still more preferably 10 to 20 walls.

The "distribution width" of the wall number distribution of the carbon nanotubes each having the plurality of walls described above refers to a difference between the maximum wall number and minimum wall number of the wall numbers of the carbon nanotubes each having the plurality of walls. In the present invention, the carbon nanotubes can bring together additionally excellent heat resistance and a high specific surface area, and furthermore, the carbon nanotubes can be a carbon nanotube aggregate showing excellent pressure-sensitive adhesive properties under temperature conditions ranging from room temperature to a high temperature when the distribution width of the wall number distribution of the carbon nanotubes each having the plurality of walls falls within the above-mentioned range. It should be noted that the wall numbers and wall number distribution of the carbon nanotubes in the present invention have only to be measured with any appropriate apparatus. The measurement is preferably performed with a scanning electron microscope (SEM) or a transmission electron microscope (TEM). For example, at least ten, or preferably twenty or more, carbon nanotubes out of the carbon nanotube aggregate have only to be evaluated for their wall numbers and wall number distribution by measurement with the SEM or TEM.

The above-mentioned maximum wall number is preferably 1 to 30, more preferably 1 to 25, or still more preferably 2 to 25. The above-mentioned minimum wall number is preferably 1 to 10, or more preferably 1 to 5. In the present invention, the carbon nanotubes can bring together further additionally excellent heat resistance and a high specific surface area, and furthermore, the carbon nanotubes can be a carbon nanotube aggregate showing excellent pressure-sensitive adhesive properties under temperature conditions ranging from room temperature to a high temperature when the maximum wall number and minimum wall number of the wall numbers of the carbon nanotubes fall within the above-mentioned ranges.

The relative frequency of the mode of the wall number distribution described above is preferably 1 to 25%, more preferably 5 to 25%, still more preferably 10 to 25%, or particularly preferably 15 to 25%. In the present invention, the carbon nanotubes can bring together further additionally excellent heat resistance and a high specific surface area, and furthermore, the carbon nanotubes can be a carbon nanotube aggregate showing excellent pressure-sensitive adhesive properties under temperature conditions ranging from room temperature to a high temperature when the relative frequency of the mode of the wall number distribution falls within the above-mentioned range.

The mode of the wall number distribution described above is present within the wall number range of preferably 1 to 10, more preferably 2 to 10, or still more preferably 3 to 10. In the present invention, the carbon nanotubes can bring together further additionally excellent heat resistance and a high specific surface area, and furthermore, the carbon nanotubes can be a carbon nanotube aggregate showing excellent pressure-sensitive adhesive properties under temperature conditions ranging from room temperature to a high temperature when the mode of the wall number distribution falls within the above-mentioned range.

With regard to the shape of each of the above-mentioned carbon nanotubes, the lateral section of the nanotube has only to have any appropriate shape. The lateral section is of, for example, a substantially circular shape, an elliptical shape, or an n-gonal shape (where n represents an integer of 3 or more).

The length of each of the above-mentioned carbon nanotubes can be set to any appropriate length. The carbon nanotubes each having the plurality of walls preferably include carbon nanotubes each having a length of 300 μm or more. The length of each of the above-mentioned carbon nanotubes is more preferably 300 to 10,000 μm, still more preferably 300 to 5000 μm, or particularly preferably 300 to 2000 μm. In the present invention, the carbon nanotubes can bring together further additionally excellent heat resistance and a high specific surface area, and furthermore, the carbon nanotubes can be a carbon nanotube aggregate showing excellent pressure-sensitive adhesive properties under temperature conditions ranging from room temperature to a high temperature when the length of each of the carbon nanotubes falls within the above-mentioned range.

In the fibrous columnar structure aggregate (3) as a carbon nanotube aggregate of the present invention, the content of carbon nanotubes each having a length of 300 μm or more in the above-mentioned carbon nanotubes each having the plurality of walls is preferably 80 to 100%, more preferably 90 to 100%, still more preferably 95 to 100%, particularly preferably 98 to 100%, or most preferably substantially 100%. The phrase "substantially 100%" as used herein refers to a state in which the content is 100% in a detection limit in a measuring instrument. In the fibrous columnar structure aggregate (3) as a carbon nanotube aggregate of the present invention, the above-mentioned carbon nanotubes each having the plurality of walls can bring together further additionally excellent heat resistance and a high specific surface area, and furthermore, the carbon nanotubes can be a carbon nanotube aggregate showing excellent pressure-sensitive adhesive properties under temperature conditions ranging from room temperature to a high temperature when the content of carbon nanotubes each having a length of 300 μm or more in the carbon nanotubes falls within the above-mentioned range.

In the fibrous columnar structure aggregate (3) as a carbon nanotube aggregate of the present invention, the shear adhesive strength for a glass surface under the 250° C. atmosphere is 0.8 to 1.2 times, preferably 0.85 to 1.15 times, or more preferably 0.9 to 1.1 times as high as the shear adhesive strength for the glass surface at room temperature. When the shear adhesive strength for the glass surface under the 250° C. atmosphere is 0.8 to 1.2 times as high as the shear adhesive strength for the glass surface at room temperature, the fibrous columnar structure aggregate (3) can be provided with excellent heat resistance, and the fibrous columnar structure aggregate (3) can be a carbon nanotube aggregate showing excellent pressure-sensitive adhesive properties under temperature conditions ranging from room temperature to a high temperature.

The fibrous columnar structure aggregate (3) as a carbon nanotube aggregate of the present invention has a shear adhesive strength for a glass surface at room temperature of preferably 15 N/cm$^2$ or more, more preferably 20 to 500 N/cm$^2$, still more preferably 30 to 100 N/cm$^2$, particularly preferably 30 to 80 N/cm$^2$, or particularly preferably 35 to 50 N/cm$^2$.

The specific surface area and density of the carbon nanotubes described above can each be set to any appropriate value.

The fibrous columnar structure aggregate (3) as a carbon nanotube aggregate of the present invention has a value for a ratio B/A of preferably 0.8 to 1.2, more preferably 0.85 to 1.15, or still more preferably 0.9 to 1.1 where A represents a shear adhesive strength for an adherend having a surface free energy a and B represents a shear adhesive strength for an adherend having a surface free energy b differing from the surface free energy a by 25 mJ/m$^2$ or more (provided that a>b). When the value for the ratio B/A is 0.8 to 1.2 where A represents the shear adhesive strength for the adherend having the surface free energy a and B represents the shear adhesive strength for the adherend having the surface free energy b differing from the surface free energy a by 25 mJ/m$^2$ or more (provided that a>b), the fibrous columnar structure aggregate (3) can be a carbon nanotube aggregate having such pressure-sensitive adhesive property that its adhesive strength for adherends different from each other in surface free energy does not change (the aggregate is free of adherend selectivity).

When the fibrous columnar structure aggregate (3) as a carbon nanotube aggregate of the present invention is peeled from a semiconductor wafer after having been crimped and bonded onto the semiconductor wafer, the number of particles each having a size of 0.28 μm or more remaining on the semiconductor wafer is preferably 30 particles/4-inch wafer or less, more preferably 25 particles/4-inch wafer or less, or still more preferably 20 particles/4-inch wafer or less. To be additionally specific, when the fibrous columnar structure aggregate (3) as a carbon nanotube aggregate of the present invention transferred onto a polypropylene resin is peeled at a 180° peel from a 4-inch semiconductor wafer after having been crimped and attached onto the semiconductor wafer with a 5-kg roller, the number of particles each having a size of 0.28 μm or more remaining on the peeled semiconductor wafer is preferably 30 particles/4-inch wafer or less, more preferably 25 particles/4-inch wafer or less, or still more preferably 20 particles/4-inch wafer or less. The fibrous columnar structure aggregate (3) as a carbon nanotube aggregate of the present invention is extremely excellent in anti-contamination property because the number of particles each having a size of 0.28 μm or more remaining on a semiconductor wafer when the aggregate is peeled from the semiconductor wafer after having been crimped and attached onto the semiconductor wafer as described above is preferably small as described above.

It should be noted that the 180° peel when evaluation for the above-mentioned anti-contamination property is performed is measured with a tension and compression tester ("TG-1kN" manufactured by Minebea Co., Ltd.) in conformity with the adhesion (180° peeling method) of JIS C 2107. It should be noted that a test piece is the very fibrous columnar structure aggregate (3) as a carbon nanotube aggregate of the present invention transferred onto the polypropylene resin (crimped and bonded onto the semiconductor wafer), the crimping is performed by reciprocating the 5-kg roller once, and the measurement is performed at a temperature of 23±2° C., a humidity of 65±5% RH, and a peeling speed of 300 mm/min.

When the fibrous columnar structure aggregate (3) as a carbon nanotube aggregate of the present invention is fixed to a base material formed of a polypropylene resin (having a thickness of 30 µm), the value for the 180° peel is preferably 1 N/20 mm or less, more preferably 0.001 to 1 N/20 mm, still more preferably 0.001 to 0.7 N/20 mm, still further more preferably 0.001 to 0.5 N/20 mm, or particularly preferably 0.001 to 0.4 N/20 mm. The fibrous columnar structure aggregate (3) as a carbon nanotube aggregate of the present invention is extremely excellent in light-peeling property because the value for the 180° peel when the aggregate is fixed to the base material formed of a polypropylene resin (having a thickness of 30 µm) is preferably small as described above. In the case of an ordinary pressure-sensitive adhesive, the value for the 180° peel is larger than 1 N/20 mm.

It should be noted that the 180° peel when evaluation for the above-mentioned light-peeling property is performed is measured with a tension and compression tester ("TG-1kN" manufactured by Minebea Co., Ltd.) in conformity with the adhesion (180° peeling method) of JIS C 2107. It should be noted that a test piece is the fibrous columnar structure aggregate (3) as a carbon nanotube aggregate of the present invention transferred onto a polypropylene resin having a width of 20 mm, a silicon wafer (bare wafer, P type, manufactured by KST) is used as a test panel, the crimping is performed by reciprocating a 2-kg roller once, and the measurement is performed at a temperature of 23±2° C., a humidity of 65±5% RH, and a peeling speed of 300 mm/min.

[Fibrous Columnar Structure Aggregate (4): Carbon Nanotube Aggregate]

A fibrous columnar structure aggregate (4) as a carbon nanotube aggregate of the present invention includes a plurality of fibrous columnar structures, in which: the fibrous columnar structures are carbon nanotubes, and the carbon nanotubes are carbon nanotubes each having a plurality of walls; the distribution width of the wall number distribution of the carbon nanotubes each having the plurality of walls is 10 walls or more, and the relative frequency of the mode of the wall number distribution is 25% or less; and when a shear adhesive strength at room temperature for an adherend having a surface free energy a is represented by A and a shear adhesive strength at room temperature for an adherend having a surface free energy b differing from the surface free energy a by 25 mJ/m$^2$ or more is represented by B (provided that a>b), a value for a ratio B/A is 0.8 to 1.2.

The distribution width of the wall number distribution of the carbon nanotubes each having the plurality of walls described above is preferably 10 to 30 walls, more preferably 10 to 25 walls, or still more preferably 10 to 20 walls.

The "distribution width" of the wall number distribution of the carbon nanotubes each having the plurality of walls described above refers to a difference between the maximum wall number and minimum wall number of the wall numbers of the carbon nanotubes each having the plurality of walls. In the present invention, the carbon nanotubes can be provided with a further additionally high specific surface area, and the carbon nanotubes can be a carbon nanotube aggregate having such pressure-sensitive adhesive property that its adhesive strength for adherends different from each other in surface free energy does not change (the aggregate is free of adherend selectivity) when the distribution width of the wall number distribution of the carbon nanotubes each having the plurality of walls falls within the above-mentioned range. It should be noted that the wall numbers and wall number distribution of the carbon nanotubes in the present invention have only to be measured with any appropriate apparatus. The measurement is preferably performed with a scanning electron microscope (SEM) or a transmission electron microscope (TEM). For example, at least ten, or preferably twenty or more, carbon nanotubes out of the carbon nanotube aggregate have only to be evaluated for their wall numbers and wall number distribution by measurement with the SEM or TEM.

The above-mentioned maximum wall number is preferably 1 to 30, more preferably 1 to 25, or still more preferably 2 to 25. The above-mentioned minimum wall number is preferably 1 to 10, or more preferably 1 to 5. In the present invention, the carbon nanotubes can be provided with a further additionally high specific surface area, and the carbon nanotubes can be a carbon nanotube aggregate having such pressure-sensitive adhesive property that its adhesive strength for adherends different from each other in surface free energy does not change (the aggregate is free of adherend selectivity) when the maximum wall number and minimum wall number of the wall numbers of the carbon nanotubes fall within the above-mentioned ranges.

The relative frequency of the mode of the wall number distribution described above is preferably 1 to 25%, more preferably 5 to 25%, still more preferably 10 to 25%, or particularly preferably 15 to 25%. In the present invention, the carbon nanotubes can be provided with a further additionally high specific surface area, and furthermore, the carbon nanotubes can be a carbon nanotube aggregate having such pressure-sensitive adhesive property that its adhesive strength for adherends different from each other in surface free energy does not change (the aggregate is free of adherend selectivity) when the relative frequency of the mode of the wall number distribution falls within the above-mentioned range.

The mode of the wall number distribution described above is present within the wall number range of preferably 1 to 10, more preferably 2 to 10, or still more preferably 3 to 10. In the present invention, the carbon nanotubes can be provided with a further additionally high specific surface area, and the carbon nanotubes can be a carbon nanotube aggregate having such pressure-sensitive adhesive property that its adhesive strength for adherends different from each other in surface free energy does not change (the aggregate is free of adherend selectivity) when the mode of the wall number distribution falls within the above-mentioned range.

With regard to the shape of each of the above-mentioned carbon nanotubes, the lateral section of the nanotube has only to have any appropriate shape. The lateral section is of, for example, a substantially circular shape, an elliptical shape, or an n-gonal shape (where n represents an integer of 3 or more).

The length of each of the above-mentioned carbon nanotubes can be set to any appropriate length. The carbon nanotubes each having the plurality of walls preferably include carbon nanotubes each having a length of 300 µm or more. The length of each of the above-mentioned carbon nanotubes is more preferably 300 to 10,000 µm, still more preferably 300 to 5000 µm, or particularly preferably 300 to 2000 µm. In the present invention, the carbon nanotubes can be provided with a further additionally high specific surface area, and the carbon nanotubes can be a carbon nanotube aggregate having such pressure-sensitive adhesive property that its adhesive strength for adherends different from each other in surface free energy does not change (the aggregate is free of adherend selectivity) when the length of each of the carbon nanotubes falls within the above-mentioned range.

In the fibrous columnar structure aggregate (4) as a carbon nanotube aggregate of the present invention, the content of carbon nanotubes each having a length of 300 μm or more in the above-mentioned carbon nanotubes each having the plurality of walls is preferably 80 to 100%, more preferably 90 to 100%, still more preferably 95 to 100%, particularly preferably 98 to 100%, or most preferably substantially 100%. The phrase "substantially 100%" as used herein refers to a state in which the content is 100% in a detection limit in a measuring instrument. In the fibrous columnar structure aggregate (4) as a carbon nanotube aggregate of the present invention, the above-mentioned carbon nanotubes each having the plurality of walls can be provided with a further additionally high specific surface area, and the carbon nanotubes can be a carbon nanotube aggregate having such pressure-sensitive adhesive property that its adhesive strength for adherends different from each other in surface free energy does not change (the aggregate is free of adherend selectivity) when the content of carbon nanotubes each having a length of 300 μm or more in the carbon nanotubes falls within the above-mentioned range.

The fibrous columnar structure aggregate (4) as a carbon nanotube aggregate of the present invention has a shear adhesive strength for a glass surface at room temperature of preferably 15 N/cm$^2$ or more, more preferably 20 to 500 N/cm$^2$, still more preferably 30 to 100 N/cm$^2$, particularly preferably 30 to 80 N/cm$^2$, or particularly preferably 35 to 50 N/cm$^2$.

The fibrous columnar structure aggregate (4) as a carbon nanotube aggregate of the present invention has a value for a ratio B/A of 0.8 to 1.2, preferably 0.85 to 1.15, or more preferably 0.9 to 1.1 where A represents a shear adhesive strength at room temperature for an adherend having a surface free energy a and B represents a shear adhesive strength at room temperature for an adherend having a surface free energy b differing from the surface free energy a by 25 mJ/m$^2$ or more (provided that a>b). When the value for the ratio B/A is 0.8 to 1.2 where A represents the shear adhesive strength at room temperature for the adherend having the surface free energy a and B represents the shear adhesive strength at room temperature for the adherend having the surface free energy b differing from the surface free energy a by 25 mJ/m$^2$ or more (provided that a>b), the fibrous columnar structure aggregate (4) can be a carbon nanotube aggregate having such pressure-sensitive adhesive property that its adhesive strength for adherends different from each other in surface free energy does not change (the aggregate is free of adherend selectivity).

The specific surface area and density of the carbon nanotubes described above can each be set to any appropriate value.

In the fibrous columnar structure aggregate (4) as a carbon nanotube aggregate of the present invention, a shear adhesive strength for a glass surface under a 250° C. atmosphere is preferably 0.8 to 1.2 times, more preferably 0.85 to 1.15 times, or still more preferably 0.9 to 1.1 times as high as a shear adhesive strength for the glass surface at room temperature. When the shear adhesive strength for the glass surface under the 250° C. atmosphere is 0.8 to 1.2 times as high as the shear adhesive strength for the glass surface at room temperature, the fibrous columnar structure aggregate (4) can be provided with excellent heat resistance, and the fibrous columnar structure aggregate (4) can be a carbon nanotube aggregate showing excellent pressure-sensitive adhesive properties under temperature conditions ranging from room temperature to a high temperature.

When the fibrous columnar structure aggregate (4) as a carbon nanotube aggregate of the present invention is peeled from a semiconductor wafer after having been crimped and bonded onto the semiconductor wafer, the number of particles each having a size of 0.28 μm or more remaining on the semiconductor wafer is preferably 30 particles/4-inch wafer or less, more preferably 25 particles/4-inch wafer or less, or still more preferably 20 particles/4-inch wafer or less. To be additionally specific, when the fibrous columnar structure aggregate (4) as a carbon nanotube aggregate of the present invention transferred onto a polypropylene resin is peeled at a 180° peel from a 4-inch semiconductor wafer after having been crimped and attached onto the semiconductor wafer with a 5-kg roller, the number of particles each having a size of 0.28 μm or more remaining on the peeled semiconductor wafer is preferably 30 particles/4-inch wafer or less, more preferably 25 particles/4-inch wafer or less, or still more preferably 20 particles/4-inch wafer or less. The fibrous columnar structure aggregate (4) as a carbon nanotube aggregate of the present invention is extremely excellent in anti-contamination property because the number of particles each having a size of 0.28 μm or more remaining on a semiconductor wafer when the aggregate is peeled from the semiconductor wafer after having been crimped and attached onto the semiconductor wafer as described above is preferably small as described above.

It should be noted that the 180° peel when evaluation for the above-mentioned anti-contamination property is performed is measured with a tension and compression tester ("TG-1kN" manufactured by Minebea Co., Ltd.) in conformity with the adhesion (180° peeling method) of JIS C 2107. It should be noted that a test piece is the very fibrous columnar structure aggregate (4) as a carbon nanotube aggregate of the present invention transferred onto the polypropylene resin (crimped and bonded onto the semiconductor wafer), the crimping is performed by reciprocating the 5-kg roller once, and the measurement is performed at a temperature of 23±2° C., a humidity of 65±5% RH, and a peeling speed of 300 mm/min.

When the fibrous columnar structure aggregate (4) as a carbon nanotube aggregate of the present invention is fixed to a base material formed of a polypropylene resin (having a thickness of 30 μm), the value for the 180° peel is preferably 1 N/20 mm or less, more preferably 0.001 to 1 N/20 mm, still more preferably 0.001 to 0.7 N/20 mm, still further more preferably 0.001 to 0.5 N/20 mm, or particularly preferably 0.001 to 0.4 N/20 mm. The fibrous columnar structure aggregate (4) as a carbon nanotube aggregate of the present invention is extremely excellent in light-peeling property because the value for the 180° peel when the aggregate is fixed to the base material formed of a polypropylene resin (having a thickness of 30 μm) is preferably small as described above. In the case of an ordinary pressure-sensitive adhesive, the value for the 180° peel is larger than 1 N/20 mm.

It should be noted that the 180° peel when evaluation for the above-mentioned light-peeling property is performed is measured with a tension and compression tester ("TG-1kN" manufactured by Minebea Co., Ltd.) in conformity with the adhesion (180° peeling method) of JIS C 2107. It should be noted that a test piece is the fibrous columnar structure aggregate (4) as a carbon nanotube aggregate of the present invention transferred onto a polypropylene resin having a width of 20 mm, a silicon wafer (bare wafer, P type, manufactured by KST) is used as a test panel, the crimping is performed by reciprocating a 2-kg roller once, and the measurement is performed at a temperature of 23±2° C., a humidity of 65±5% RH, and a peeling speed of 300 mm/min.

[Method of Producing Fibrous Columnar Structure Aggregate]

Any appropriate method can be adopted as a method of producing the fibrous columnar structure aggregate of the present invention. A method of producing a fibrous columnar structure aggregate as a carbon nanotube aggregate is described as an example of a preferred embodiment of the method of producing the fibrous columnar structure aggregate of the present invention.

Any appropriate method can be adopted as the method of producing the fibrous columnar structure aggregate as a carbon nanotube aggregate of the present invention. The method is, for example, a method of producing an aggregate of carbon nanotubes aligned substantially perpendicularly from a smooth substrate by chemical vapor deposition (CVD) involving forming a catalyst layer on the substrate and filling a carbon source in a state in which a catalyst is activated with heat, plasma, or the like to grow the carbon nanotubes. In this case, removing the substrate provides an aggregate of the carbon nanotubes aligned in a lengthwise direction.

Any appropriate substrate can be adopted as the above-mentioned substrate. The substrate is, for example, a material having smoothness and high-temperature heat resistance enough to resist the production of the carbon nanotubes. Examples of such material include quartz glass, silicon (such as a silicon wafer), and a metal plate made of, for example, aluminum.

Figure 2:
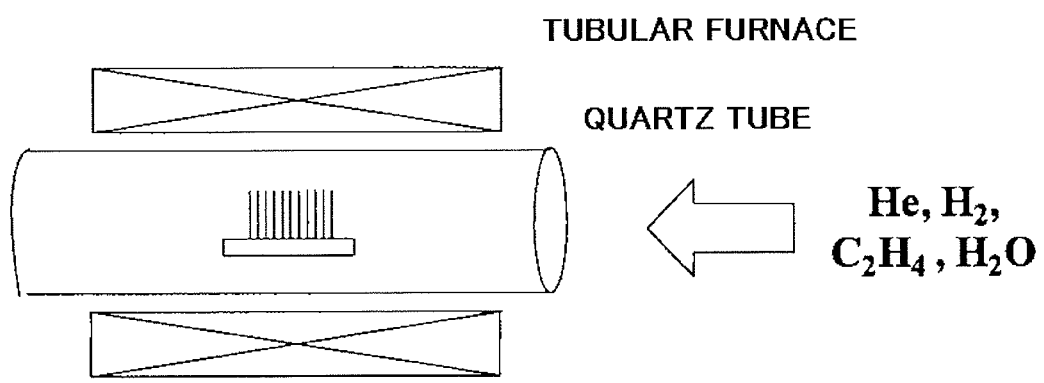
FIG. 2 is a schematic sectional view of a carbon nanotube aggregate-producing apparatus in a preferred embodiment of the present invention.

Any appropriate apparatus can be adopted as an apparatus for producing the fibrous columnar structure aggregate as a carbon nanotube aggregate of the present invention. The apparatus is, for example, a thermal CVD apparatus of a hot wall type formed by surrounding a cylindrical reaction vessel with a resistance heating electric tubular furnace as illustrated in FIG. 2. In this case, for example, a heat-resistant quartz tube is preferably used as the reaction vessel.

Any appropriate catalyst can be used as the catalyst (material for the catalyst layer) that can be used in the production of the fibrous columnar structure aggregate as a carbon nanotube aggregate of the present invention. Examples of the catalyst include metal catalysts such as iron, cobalt, nickel, gold, platinum, silver, and copper.

Upon production of the fibrous columnar structure aggregate as a carbon nanotube aggregate of the present invention, an alumina/hydrophilic film may be provided between the substrate and the catalyst layer as required.

Any appropriate method can be adopted as a method of producing the alumina/hydrophilic film. For example, the film can be obtained by producing an $SiO_2$ film on the substrate, depositing Al from the vapor, and increasing the temperature of Al to 450° C. after the deposition to oxidize Al. According to such production method, $Al_2O_3$ interacts with the hydrophilic $SiO_2$ film, and hence an $Al_2O_3$ surface different from that obtained by directly depositing $Al_2O_3$ from the vapor in particle diameter is formed. When Al is deposited from the vapor, and then its temperature is increased to 450° C. so that Al may be oxidized without the production of any hydrophilic film on the substrate, it may be difficult to form the $Al_2O_3$ surface having a different particle diameter. In addition, when the hydrophilic film is produced on the substrate and $Al_2O_3$ is directly deposited from the vapor, it may also be difficult to form the $Al_2O_3$ surface having a different particle diameter.

The catalyst layer that can be used in the production of the fibrous columnar structure aggregate as a carbon nanotube aggregate of the present invention has a thickness of preferably 0.01 to 20 nm, or more preferably 0.1 to 10 nm in order that fine particles may be formed. When the thickness of the catalyst layer that can be used in the production of the fibrous columnar structure aggregate as a carbon nanotube aggregate of the present invention falls within the above-mentioned range, the fibrous columnar structures can bring together excellent mechanical properties and a high specific surface area, and furthermore, the fibrous columnar structures can be a fibrous columnar structure aggregate showing excellent pressure-sensitive adhesive property. Any appropriate method can be adopted as a method of forming the catalyst layer. Examples of the method include a method involving depositing a metal catalyst from the vapor, for example, with an electron beam (EB) or by sputtering and a method involving applying a suspension of metal catalyst fine particles onto the substrate.

Any appropriate carbon source can be used as the carbon source that can be used in the production of the fibrous columnar structure aggregate as a carbon nanotube aggregate of the present invention. Examples of the carbon source include: hydrocarbons such as methane, ethylene, acetylene, and benzene; and alcohols such as methanol and ethanol.

Any appropriate temperature can be adopted as a production temperature in the production of the fibrous columnar structure aggregate as a carbon nanotube aggregate of the present invention. For example, the temperature is preferably 400 to 1000° C., more preferably 500 to 900° C., or still more preferably 600 to 800° C. in order that catalyst particles allowing sufficient expression of an effect of the present invention may be formed.

[Pressure-Sensitive Adhesive Member]

A pressure-sensitive adhesive member of the present invention uses the fibrous columnar structure aggregate of the present invention. The pressure-sensitive adhesive member of the present invention is preferably such that the fibrous columnar structure aggregate of the present invention is provided with a base material. Specific examples of the member include a pressure-sensitive adhesive sheet and a pressure-sensitive adhesive film.

Examples of the base material of the pressure-sensitive adhesive member include quartz glass, silicon (such as a silicon wafer), an engineering plastic, and a super engineering plastic. Specific examples of the engineering plastic and the super engineering plastic include a polyimide, a polyethylene, a polyethylene terephthalate, an acetylcellulose, a polycarbonate, a polypropylene, and a polyamide. Any appropriate physical property can be adopted as each of various physical properties such as a molecular weight to such an extent that an object of the present invention can be achieved.

The thickness of the base material can be set to any appropriate value depending on purposes. In the case of, for example, a silicon substrate, the thickness is preferably 100 to 10,000 μm, more preferably 100 to 5000 μm, or still more preferably 100 to 2000 μm. In the case of, for example, a polypropylene substrate, the thickness is preferably 1 to 1000 μm, more preferably 1 to 500 μm, or still more preferably 5 to 100 μm.

The surface of the above-mentioned base material may be subjected to a conventional surface treatment, e.g., a chemical or physical treatment such as a chromic acid treatment, exposure to ozone, exposure to a flame, exposure to a high-voltage electric shock, or an ionizing radiation treatment, or a coating treatment with an under coat (such as the above-mentioned adherent material) in order that adhesiveness with an adjacent layer, retentivity, or the like may be improved.

The above-mentioned base material may be a single layer, or may be a multilayer body.

When the fibrous columnar structure aggregate of the present invention is fixed to the base material, any appropriate method can be adopted as a method of fixing the aggregate. For example, the substrate used in the production of the fibrous columnar structures may be used as it is as a base material. Alternatively, the aggregate may be fixed by providing the base material with an adhesion layer. Further, when the base material is a thermosetting resin, the aggregate has only to be fixed as described below. That is, a thin film is produced in a state before a reaction, one end of a carbon nanotube is crimped onto the thin film layer, and then a curing treatment is performed. In addition, when the base material is a thermoplastic resin, a metal, or the like, the aggregate has only to be fixed by crimping one end of each fibrous columnar structure in a state in which the base material is molten, and cooling the resultant to room temperature.

EXAMPLES

Hereinafter, the present invention is described with reference to examples. However, the present invention is not limited to these examples. It should be noted that evaluation for the diameters and diameter distribution of fibrous columnar structures in a fibrous columnar structure aggregate, evaluation for the wall numbers and wall number distribution of the fibrous columnar structures in the fibrous columnar structure aggregate, the measurement of the shear adhesive strength of the fibrous columnar structure aggregate, and evaluation for the surface free energy of an adherend were performed by the following methods.

<Evaluation for Diameters and Diameter Distribution of Fibrous Columnar Structures in Fibrous Columnar Structure Aggregate>

The diameters and diameter distribution of the fibrous columnar structures in the fibrous columnar structure aggregate of the present invention were measured with a scanning electron microscope (SEM) and/or a transmission electron microscope (TEM). At least ten, or preferably twenty or more, fibrous columnar structures out of the resultant fibrous columnar structure aggregate were observed with the SEM and/or the TEM, the diameters of the respective fibrous columnar structures were examined, and a diameter distribution was created.

<Evaluation for Wall Numbers and Wall Number Distribution of Fibrous Columnar Structures in Fibrous Columnar Structure Aggregate>

The wall numbers and wall number distribution of the fibrous columnar structures in the fibrous columnar structure aggregate of the present invention were measured with a scanning electron microscope (SEM) and/or a transmission electron microscope (TEM). At least ten, or preferably twenty or more, fibrous columnar structures out of the resultant fibrous columnar structure aggregate were observed with the SEM and/or the TEM, the wall numbers of the respective fibrous columnar structures were examined, and a wall number distribution was created.

<Measurement Method (A) for Shear Adhesive Strength of Fibrous Columnar Structure Aggregate>

A fibrous columnar structure aggregate with a base material cut out so as to have a unit area of 1 cm² was mounted on a glass (MATSUNAMI slide glass 27 mm×56 mm) so that its tip might contact the glass. Then, the tips of the fibrous columnar structures were crimped onto the glass by reciprocating a 5-kg roller once. After that, the resultant was left to stand for 30 minutes. A shearing test was performed with a tensile tester (Instro Tensil Tester) at a tension speed of 50 mm/min at 25° C. or 250° C., and the resultant peak was defined as a shear adhesive strength.

<Measurement Method (B) for Shear Adhesive Strength of Fibrous Columnar Structure Aggregate>

A carbon nanotube aggregate with a base material cut out so as to have a unit area of 1 cm² was mounted on a glass (MATSUNAMI slide glass 27 mm×56 mm, surface free energy=64.4 mJ/m²) and PP plate (manufactured by Shinkobe Electric Machinery Co., Ltd., KOBE POLYSHEET PP-N-AN, surface free energy=29.8 mJ/m²) so that its tip might contact the glass and the PP plate, respectively. Then, the tips of the carbon nanotube aggregate were crimped onto the glass by reciprocating a 5-kg roller once. After that, the resultant was left to stand for 30 minutes. A shearing test was performed with a tensile tester (Instro Tensil Tester) at a tension speed of 50 mm/min at 25° C., and the resultant peak was defined as a shear adhesive strength.

<Evaluation for Surface Free Energy of Adherend>

Three kinds of liquids (water, glycerin, and methylene iodide) were each dropped onto the surface of an adherend. After that, a contact angle at 100 ms was measured, and the surface free energy was determined with the value by the following method.

Method of calculating surface free energy:

$$\gamma_L(1+\cos\theta) = 2(\gamma_L^d \cdot \gamma_S^d)^{1/2} + 2(\gamma_L^p \cdot \gamma_S^p)^{1/2} \quad (1)$$

$\gamma_L$: the surface free energy of a liquid used in the contact angle measurement $\gamma_L^d$: the dispersion component of the surface free energy of the liquid $\gamma_L^p$: the polar component of the surface free energy of the liquid $\gamma_S$: the surface free energy of a solid to be determined $\gamma_S^d$: the dispersion component of the surface free energy of the solid $\gamma_S^p$: the polar component of the surface free energy of the solid The equation (1) was transformed into a linear function of $(\gamma_L^p/\gamma_L^d)^{1/2}$ and $\gamma_L(1+\cos\theta)/2(\gamma_L^d)^{1/2}$.

$$\gamma_L(1+\cos\theta)/2(\gamma_L^d)^{1/2} = (\gamma_S^p)^{1/2}(\gamma_L^p/\gamma_L^d)^{1/2} + (\gamma_S^d)^{1/2} \quad (2)$$

In the equation (2), $\gamma_S^d$ was determined by squaring the "gradient" and $\gamma_S^p$ was determined by squaring the "intercept", and the surface free energy was calculated from the equation "$\gamma_S = \gamma_S^d + \gamma_S^p$."

Example 1

Production of Carbon Nanotube Aggregate

An Al thin film (having a thickness of 10 nm) was formed on a silicon substrate having an SiO₂ film on its surface (wafer with a thermal oxide film, manufactured by KST, SiO₂ film thickness=1 μm, the total thickness of the SiO₂ film and the silicon substrate=550 μm) with a vacuum evaporator (manufactured by JEOL Ltd., JEE-4X Vacuum Evaporator). After that, the resultant was subjected to an oxidation treatment at 450° C. for 1 hour. Thus, an Al₂O₃ film was formed on the silicon substrate. An Fe thin film (having a thickness of 2 nm) was further deposited from the vapor onto the Al₂O₃ film with a sputtering apparatus (manufactured by ULVAC, Inc., RFS-200). Thus, a catalyst layer was formed.

Next, the silicon substrate with the catalyst layer was cut and mounted in a quartz tube having a diameter of 30 mm. A mixed gas of helium and hydrogen (120/80 sccm) with its moisture content kept at 350 ppm was flowed into the quartz tube for 30 minutes so that the air in the tube might be replaced. After that, the temperature in the tube was increased to 765° C. with an electric tubular furnace in 35 minutes in a stepwise fashion, and was then stabilized at 765° C. After the tube had been left to stand at 765° C. for 10 minutes, a mixed gas of helium, hydrogen, and ethylene (105/80/15 sccm, moisture content: 350 ppm) was filled into the tube while the temperature was retained. Then, the tube was left to stand for 30 minutes so that carbon nanotubes might be grown on the substrate. Thus, a carbon nanotube aggregate (1) was obtained.

The carbon nanotube aggregate (1) had a length of 638 µm.

Figure 3:
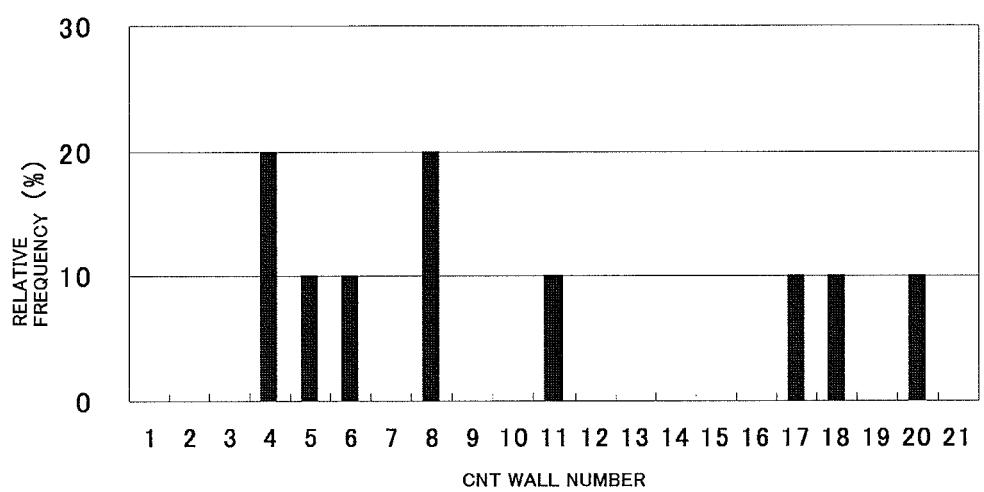
FIG. 3 is a view illustrating the wall number distribution of a carbon nanotube aggregate (1) obtained in Example 1.

FIG. 3 illustrates the wall number distribution of the carbon nanotube aggregate (1). As illustrated in FIG. 3, modes were present at 4 walls and 8 walls, and each had a relative frequency of 20%.

In addition, the distribution width of the diameter distribution of the carbon nanotube aggregate (1), a mode of the diameter distribution, and the relative frequency of the mode were also measured.

Table 1 summarizes the results.

(Measurement of Shear Adhesive Strength)

A polypropylene resin (manufactured by KYOKUYO PULP & PAPER CO., LTD and having a thickness of 30 µm) was heated to 200° C. on a hot plate so as to melt. One end (upper end) of each of the carbon nanotubes formed on the above-mentioned substrate so as to be perpendicularly aligned was crimped onto the molten polypropylene resin. After that, the carbon nanotubes were fixed by cooling the resultant to room temperature. Thus, the carbon nanotube aggregate (1) with a base material was obtained.

A shear adhesive strength was measured by using the carbon nanotube aggregate (1) with the base material as a sample at 25° C. (measurement method (A)). The shear adhesive strength was 44.6 N/cm².

Table 1 summarizes the result.

Example 2

A carbon nanotube aggregate (2) was produced in the same manner as in Example 1 except that a mixed gas of helium, hydrogen, and ethylene (105/80/15 sccm, moisture content: 350 ppm) was filled into the quartz tube, and then the tube was left to stand for 20 minutes so that carbon nanotubes might be grown on the substrate.

The carbon nanotube aggregate (2) had a length of 420 µm.

Figure 4:
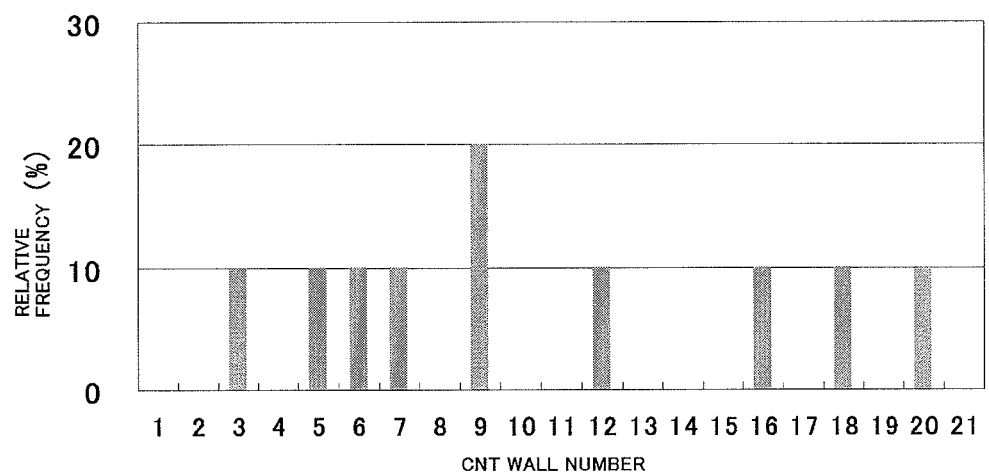
FIG. 4 is a view illustrating the wall number distribution of a carbon nanotube aggregate (2) obtained in Example 2.

FIG. 4 illustrates the wall number distribution of the carbon nanotube aggregate (2). As illustrated in FIG. 4, a mode was present at 9 walls, and had a relative frequency of 20%.

In addition, the distribution width of the diameter distribution of the carbon nanotube aggregate (2), a mode of the diameter distribution, and the relative frequency of the mode were also measured.

The carbon nanotube aggregate (2) with a base material was obtained in the same manner as in Example 1.

A shear adhesive strength was measured by using the carbon nanotube aggregate (2) with the base material as a sample at 25° C. (measurement method (A)). The shear adhesive strength was 36.1 N/cm².

Table 1 summarizes the results.

Comparative Example 1

Production of Carbon Nanotube Aggregate

An Al thin film (having a thickness of 10 nm) was formed on a silicon substrate (manufactured by ELECTRONICS AND MATERIALS CORPORATION LIMITED and having a thickness of 525 µm) with a vacuum evaporator (manufactured by JEOL Ltd., JEE-4X Vacuum Evaporator). After that, the resultant was subjected to an oxidation treatment at 450° C. for 1 hour. Thus, an $Al_2O_3$ film was formed on the silicon substrate. An Fe thin film (having a thickness of 0.67 nm) was further deposited from the vapor onto the $Al_2O_3$ film with a sputtering apparatus (manufactured by ULVAC, Inc., RFS-200). Thus, a catalyst layer was formed.

Next, the silicon substrate with the catalyst layer was cut and mounted in a quartz tube having a diameter of 30 mm. A mixed gas of helium and hydrogen (120/80 sccm) with its moisture content kept at 350 ppm was flowed into the quartz tube for 30 minutes so that the air in the tube might be replaced. After that, the temperature in the tube was increased to 765° C. with an electric tubular furnace in 35 minutes in a stepwise fashion, and was then stabilized at 765° C. After the tube had been left to stand at 765° C. for 10 minutes, a mixed gas of helium, hydrogen, and ethylene (105/80/15 sccm, moisture content: 350 ppm) was filled into the tube while the temperature was retained. Then, the tube was left to stand for 30 minutes so that carbon nanotubes might be grown on the substrate. Thus, a carbon nanotube aggregate (C1) was obtained.

The carbon nanotube aggregate (C1) had a length of 799 µm.

Figure 5:
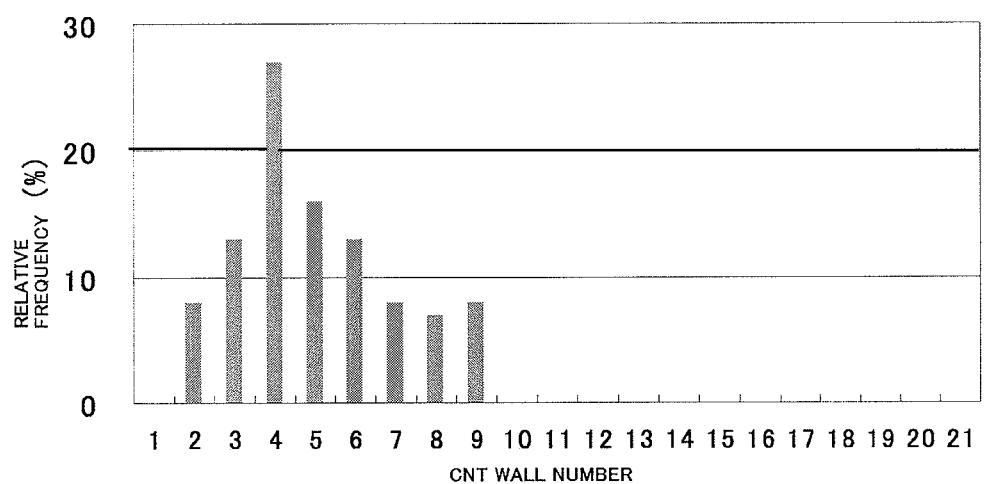
FIG. 5 is a view illustrating the wall number distribution of a carbon nanotube aggregate (C1) obtained in Comparative Example 1.

FIG. 5 illustrates the wall number distribution of the carbon nanotube aggregate (C1). As illustrated in FIG. 5, a mode was present at 4 walls, and had a relative frequency of 27%.

In addition, the distribution width of the diameter distribution of the carbon nanotube aggregate (C1), a mode of the diameter distribution, and the relative frequency of the mode were also measured.

Table 1 summarizes the results.

(Measurement of Shear Adhesive Strength)

A polypropylene resin (manufactured by KYOKUYO PULP & PAPER CO., LTD and having a thickness of 30 µm) was heated to 200° C. on a hot plate so as to melt. One end (upper end) of each of the carbon nanotubes formed on the above-mentioned substrate so as to be perpendicularly aligned was crimped onto the molten polypropylene resin. After that, the carbon nanotubes were fixed by cooling the resultant to room temperature. Thus, the carbon nanotube aggregate (C1) with a base material was obtained.

A shear adhesive strength was measured by using the carbon nanotube aggregate (C1) with the base material as a sample at 25° C. (measurement method (A)). The shear adhesive strength was 7.9 N/cm².

Table 1 summarizes the result.

TABLE 1

|  | Distribution width of diameter distribution | Mode of diameter distribution (relative frequency) | Distribution width of wall number distribution | Mode of wall number distribution (relative frequency) | Length of carbon nanotube aggregate (µm) | Shear adhesive strength (N/cm²) |
|---|---|---|---|---|---|---|
| Example 1 | 16 nm (9 to 24 nm) | 12 nm (25%) | 17 walls (4 to 20 walls) | 4 walls (20%) 8 walls (20%) | 638 | 44.6 |
| Example 2 | 17 nm (8 to 24 nm) | 11 nm (22%) | 18 walls (3 to 20 walls) | 9 walls (20%) | 420 | 36.1 |

TABLE 1-continued

|  | Distribution width of diameter distribution | Mode of diameter distribution (relative frequency) | Distribution width of wall number distribution | Mode of wall number distribution (relative frequency) | Length of carbon nanotube aggregate (μm) | Shear adhesive strength (N/cm$^2$) |
|---|---|---|---|---|---|---|
| Comparative Example 1 | 5 nm (10 to 14 nm) | 13 nm (40%) | 8 walls (2 to 9 walls) | 4 walls (27%) | 799 | 7.9 |

As observed in each of Examples 1 and 2, when the wall number distribution of carbon nanotubes as fibrous columnar structures was disperse and the relative frequency of a mode of the wall number distribution was 25% or less, a shear adhesive strength for a glass surface showed a value of 30 N/cm$^2$ or more. In contrast, as observed in Comparative Example 1, when the wall number distribution of carbon nanotubes as fibrous columnar structures was monodisperse and the relative frequency of a mode of the wall number distribution exceeded 25%, a shear adhesive strength showed a low value of less than 10 N/cm$^2$.

The mechanism via which the high shear adhesive strength can be expressed in each of Examples 1 and 2 is considered to be as described below. Carbon nanotubes each having a small number of walls each follow the surface unevenness of the glass to have an increased contact area, and hence strong adhesion is expressed. However, the carbon nanotubes may be unable to follow the surface unevenness of the glass owing to their cohesion. In contrast, carbon nanotubes each having a large number of walls each follow the surface unevenness of the glass to a low degree. However, no cohesion of the carbon nanotubes occurs, and hence a reduction in adhesive strength is small. In each of Examples 1 and 2, carbon nanotubes each having a small number of walls and carbon nanotubes each having a large number of walls are caused to exist in a wide distribution. As a result, the cohesion of the carbon nanotubes is prevented, and the carbon nanotubes each independently function. In addition, the carbon nanotubes each follow the surface unevenness of the glass to have an increased adhesion area, and hence strong adhesion may be expressed.

It should be noted that a cause for the broadening of the distribution of the carbon nanotubes in each of Examples 1 and 2 is considered to be as described below. With regard to the carbon nanotubes, the Fe deposited film is made thicker than a conventional one. As a result, the formation of fine particles at high temperatures is partly prevented, and hence the distribution of Fe particle diameters broadens, which may be attributable to the above-mentioned broadening. In addition, even in the case of an Fe deposited film thickness like the conventional one, the use of the Si substrate with the SiO$_2$ oxide film broadens the distribution of the surface unevenness of Al$_2$O$_3$, which may affect the diameter distribution of Fe fine particles.

Example 3

Production of Carbon Nanotube Aggregate

An Al thin film (having a thickness of 10 nm) was formed on a silicon substrate having an SiO$_2$ film on its surface (wafer with a thermal oxide film, manufactured by KST, SiO$_2$ film thickness=1 μm, the total thickness of the SiO$_2$ film and the silicon substrate=550 μm) with a vacuum evaporator (manufactured by JEOL Ltd., JEE-4X Vacuum Evaporator). After that, the resultant was subjected to an oxidation treatment at 450° C. for 1 hour. Thus, an Al$_2$O$_3$ film was formed on the silicon substrate. An Fe thin film (having a thickness of 2 nm) was further deposited from the vapor onto the Al$_2$O$_3$ film with a sputtering apparatus (manufactured by ULVAC, Inc., RFS-200). Thus, a catalyst layer was formed.

Next, the silicon substrate with the catalyst layer was cut and mounted in a quartz tube having a diameter of 30 mm. A mixed gas of helium and hydrogen (120/80 sccm) with its moisture content kept at 350 ppm was flowed into the quartz tube for 30 minutes so that the air in the tube might be replaced. After that, the temperature in the tube was increased to 700° C. with an electric tubular furnace in 30 minutes in a stepwise fashion, and was then stabilized at 700° C. After the tube had been left to stand at 700° C. for 10 minutes, a mixed gas of helium, hydrogen, and ethylene (105/80/15 sccm, moisture content: 350 ppm) was filled into the tube while the temperature was retained. Then, the tube was left to stand for 30 minutes so that carbon nanotubes might be grown on the substrate. Thus, a carbon nanotube aggregate (3) was obtained.

The carbon nanotube aggregate (3) had a length of 722 μm.

Figure 6:
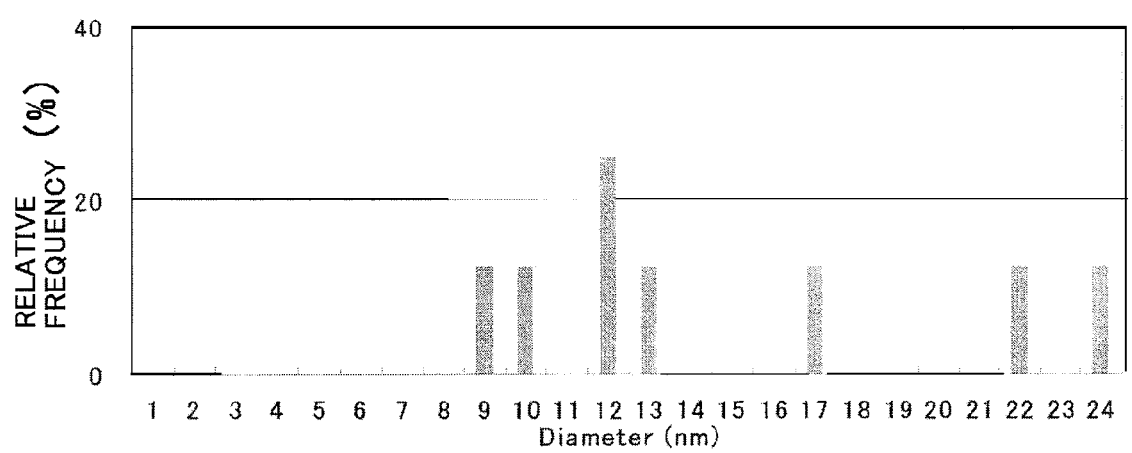
FIG. 6 is a view illustrating the diameter distribution of a carbon nanotube aggregate (3) obtained in Example 3.

FIG. 6 illustrates the wall number distribution of the carbon nanotube aggregate (3). As illustrated in FIG. 6, a mode was present at 12 nm, and had a relative frequency of 25%.

In addition, the distribution width of the wall number distribution of the carbon nanotube aggregate (3), a mode of the wall number distribution, and the relative frequency of the mode were also measured.

Table 2 summarizes the results.

(Measurement of Shear Adhesive Strength)

A polypropylene resin (manufactured by KYOKUYO PULP & PAPER CO., LTD and having a thickness of 30 μm) was heated to 200° C. on a hot plate so as to melt. One end (upper end) of each of the carbon nanotubes formed on the above-mentioned substrate so as to be perpendicularly aligned was crimped onto the molten polypropylene resin. After that, the carbon nanotubes were fixed by cooling the resultant to room temperature. Thus, the carbon nanotube aggregate (3) with a base material was obtained.

A shear adhesive strength was measured by using the carbon nanotube aggregate (3) with the base material as a sample at 25° C. (measurement method (A)). The shear adhesive strength was 40.5 N/cm$^2$.

Table 2 summarizes the result.

Example 4

A carbon nanotube aggregate (4) was produced in the same manner as in Example 3 except that a mixed gas of helium, hydrogen, and ethylene (105/80/15 sccm, moisture content: 350 ppm) was filled into the quartz tube, and then the tube was left to stand for 20 minutes so that carbon nanotubes might be grown on the substrate.

The carbon nanotube aggregate (4) had a length of 570 μm.

Figure 7:
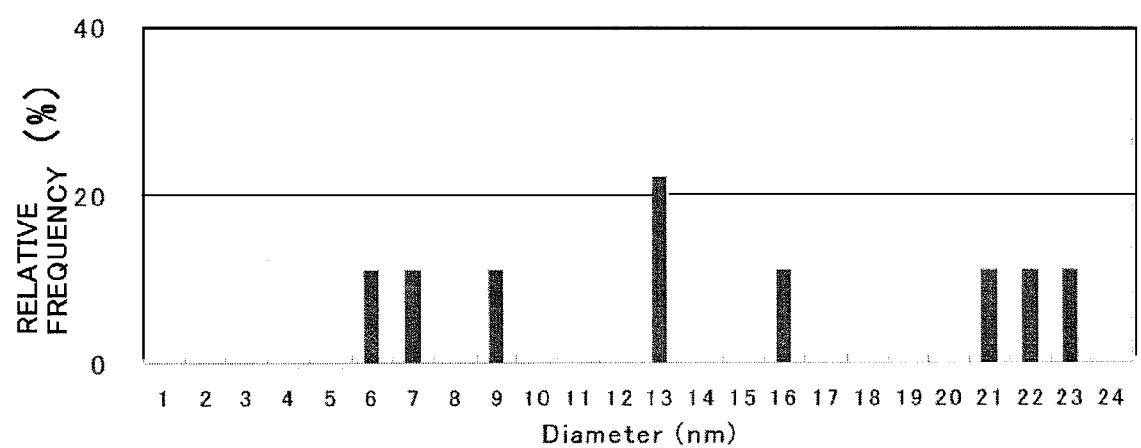
FIG. 7 is a view illustrating the diameter distribution of a carbon nanotube aggregate (4) obtained in Example 4.

FIG. 7 illustrates the diameter distribution of the carbon nanotube aggregate (4). As illustrated in FIG. 7, a mode was present at 13 nm, and had a relative frequency of 22.2%.

In addition, the distribution width of the wall number distribution of the carbon nanotube aggregate (4), a mode of the wall number distribution, and the relative frequency of the mode were also measured.

The carbon nanotube aggregate (4) with a base material was obtained in the same manner as in Example 3.

A shear adhesive strength was measured by using the carbon nanotube aggregate (4) with the base material as a sample at 25° C. (measurement method (A)). The shear adhesive strength was 31.2 N/cm².

Table 2 summarizes the results.

Comparative Example 2

Production of Carbon Nanotube Aggregate

An Al thin film (having a thickness of 10 nm) was formed on a silicon substrate (manufactured by ELECTRONICS AND MATERIALS CORPORATION LIMITED and having a thickness of 525 μm) with a vacuum evaporator (manufactured by JEOL Ltd., JEE-4X Vacuum Evaporator). After that, the resultant was subjected to an oxidation treatment at 450° C. for 1 hour. Thus, an $Al_2O_3$ film was formed on the silicon substrate. An Fe thin film (having a thickness of 0.67 nm) was further deposited from the vapor onto the $Al_2O_3$ film with a sputtering apparatus (manufactured by ULVAC, Inc., RFS-200). Thus, a catalyst layer was formed.

Next, the silicon substrate with the catalyst layer was cut and mounted in a quartz tube having a diameter of 30 mm. A mixed gas of helium and hydrogen (120/80 sccm) with its moisture content kept at 350 ppm was flowed into the quartz tube for 20 minutes so that the air in the tube might be replaced. After that, the temperature in the tube was increased to 700° C. with an electric tubular furnace in 30 minutes in a stepwise fashion, and was then stabilized at 700° C. After the tube had been left to stand at 700° C. for 10 minutes, a mixed gas of helium, hydrogen, and ethylene (105/80/15 sccm, moisture content: 350 ppm) was filled into the tube while the temperature was retained. Then, the tube was left to stand for 20 minutes so that carbon nanotubes might be grown on the substrate. Thus, a carbon nanotube aggregate (C2) was obtained.

The carbon nanotube aggregate (C2) had a length of 589 μm.

Figure 8:
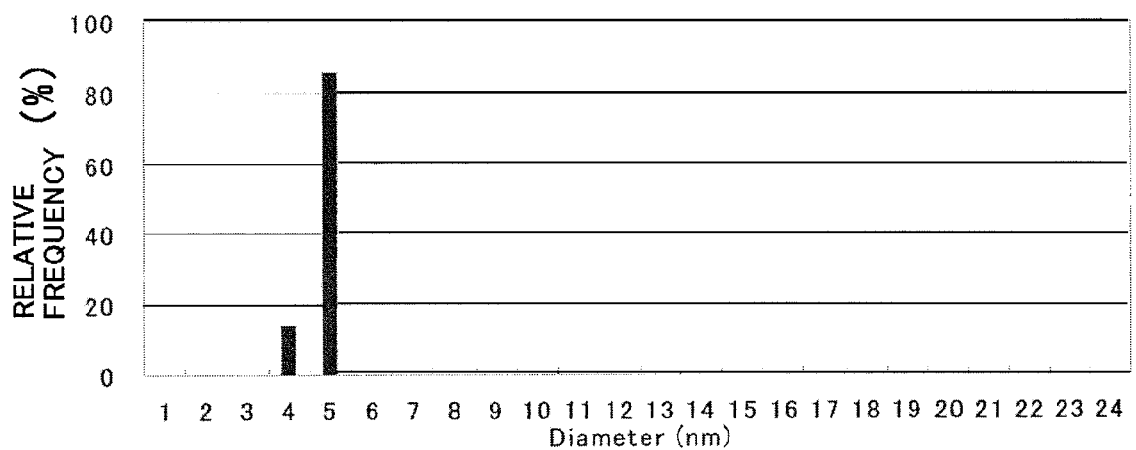
FIG. 8 is a view illustrating the diameter distribution of a carbon nanotube aggregate (C2) obtained in Comparative Example 2.

FIG. 8 illustrates the diameter distribution of the carbon nanotube aggregate (C2). As illustrated in FIG. 8, a mode was present at 5 nm, and had a relative frequency of 85.7%.

In addition, the distribution width of the wall number distribution of the carbon nanotube aggregate (C2), a mode of the wall number distribution, and the relative frequency of the mode were also measured.

Table 2 summarizes the results.

(Measurement of Shear Adhesive Strength)

A polypropylene resin (manufactured by KYOKUYO PULP & PAPER CO., LTD and having a thickness of 30 μm) was heated to 200° C. on a hot plate so as to melt. One end (upper end) of each of the carbon nanotubes formed on the above-mentioned substrate so as to be perpendicularly aligned was crimped onto the molten polypropylene resin. After that, the carbon nanotubes were fixed by cooling the resultant to room temperature. Thus, the carbon nanotube aggregate (C2) with a base material was obtained.

A shear adhesive strength was measured by using the carbon nanotube aggregate (C2) with the base material as a sample at 25° C. (measurement method (A)). The shear adhesive strength was 15.3 N/cm².

Table 2 summarizes the result.

Comparative Example 3

A carbon nanotube aggregate (C3) was produced in the same manner as in Comparative Example 2 except that a mixed gas of helium, hydrogen, and ethylene (105/80/15 sccm, moisture content: 350 ppm) was filled into the quartz tube, and then the tube was left to stand for 10 minutes so that carbon nanotubes might be grown on the substrate.

The carbon nanotube aggregate (C3) had a length of 630 μm.

Figure 9:
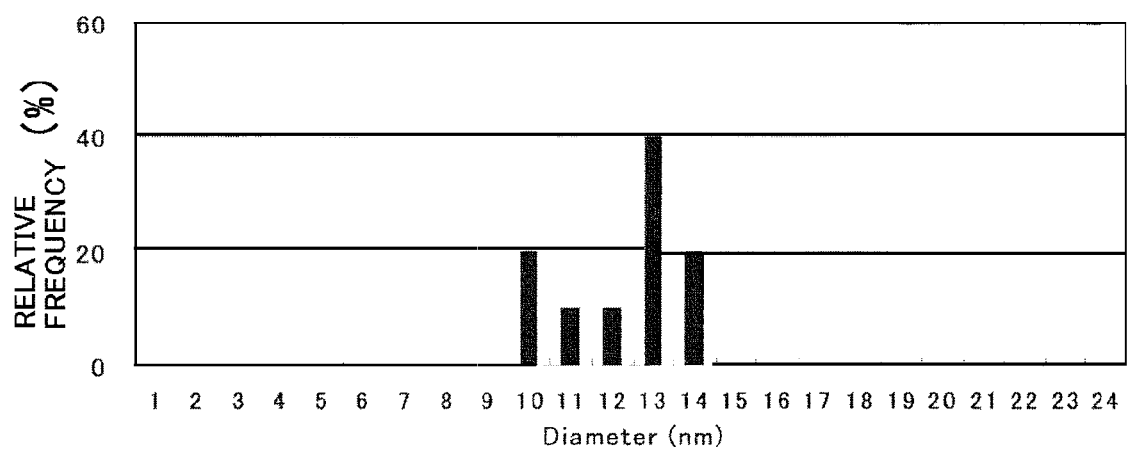
FIG. 9 is a view illustrating the diameter distribution of a carbon nanotube aggregate (C3) obtained in Comparative Example 3.

FIG. 9 illustrates the diameter distribution of the carbon nanotube aggregate (C3). As illustrated in FIG. 9, a mode was present at 13 nm, and had a relative frequency of 40%.

In addition, the distribution width of the wall number distribution of the carbon nanotube aggregate (C3), a mode of the wall number distribution, and the relative frequency of the mode were also measured.

The carbon nanotube aggregate (C3) with a base material was obtained in the same manner as in Comparative Example 2.

A shear adhesive strength was measured by using the carbon nanotube aggregate (C3) with the base material as a sample at 25° C. (measurement method (A)). The shear adhesive strength was 11.5 N/cm².

Table 2 summarizes the results.

TABLE 2

|  | Distribution width of diameter distribution | Mode of diameter distribution (relative frequency) | Length of carbon nanotube aggregate (μm) | Shear adhesive strength (N/cm²) |
|---|---|---|---|---|
| Example 3 | 16 nm (9 to 24 nm) | 12 nm (25%) | 722 | 40.5 |
| Example 4 | 18 nm (6 to 23 nm) | 13 nm (22.2%) | 570 | 31.2 |
| Comparative Example 2 | 2 nm (4 to 5 nm) | 5 nm (85.7%) | 589 | 15.3 |
| Comparative Example 3 | 5 nm (10 to 14 nm) | 13 nm (40%) | 630 | 11.5 |

As observed in each of Examples 3 and 4, when the diameter distribution of carbon nanotubes as fibrous columnar structures was disperse and the relative frequency of a mode of the diameter distribution was 30% or less, a shear adhesive strength for a glass surface showed a value of 30 N/cm² or more. In contrast, as observed in Comparative Example 2, when the diameter distribution of carbon nanotubes as fibrous columnar structures was monodisperse and the relative frequency of a mode of the diameter distribution exceeded 30%, or as observed in Comparative Example 3, when a mode of the diameter distribution of carbon nanotubes as fibrous columnar structures fell within the range of 5 nm to 15 nm but the relative frequency of the mode of the diameter distribution exceeded 30%, a shear adhesive strength showed a low value of less than 20 N/cm$^2$.

The mechanism via which the high shear adhesive strength can be expressed in each of Examples 3 and 4 is considered to be as described below. Fibrous columnar structures each having a small diameter each follow the surface unevenness of the glass to have an increased contact area, and hence strong adhesion is expressed. However, the fibrous columnar structures may be unable to follow the surface unevenness of the glass owing to their cohesion. In contrast, fibrous columnar structures each having a large diameter each follow the surface unevenness of the glass to a low degree. However, no cohesion of the fibrous columnar structures occurs, and hence a reduction in adhesive strength is small. In each of Examples 3 and 4, fibrous columnar structures each having a small diameter and fibrous columnar structures each having a large diameter are caused to exist in a wide distribution. As a result, the cohesion of the fibrous columnar structures is prevented, and the fibrous columnar structures each independently function. In addition, the fibrous columnar structures each follow the surface unevenness of the glass to have an increased adhesion area, and hence strong adhesion may be expressed.

It should be noted that a cause for the broadening of the distribution of the fibrous columnar structures in each of Examples 3 and 4 is considered to be as described below. With regard to the fibrous columnar structures, the Fe deposited film is made thicker than a conventional one. As a result, the formation of fine particles at high temperatures is partly prevented, and hence the distribution of Fe particle diameters broadens, which may be attributable to the above-mentioned broadening. In addition, even in the case of an Fe deposited film thickness like the conventional one, the use of the Si substrate with the SiO$_2$ oxide film broadens the distribution of the surface unevenness of Al$_2$O$_3$, which may affect the diameter distribution of Fe fine particles.

Example 5

Production of Carbon Nanotube Aggregate

An Al thin film (having a thickness of 10 nm) was formed on a silicon substrate having an SiO$_2$ film on its surface (wafer with a thermal oxide film, manufactured by KST, SiO$_2$ film thickness=0.5 μm, the total thickness of the SiO$_2$ film and the silicon substrate=550 μm) with a vacuum evaporator (manufactured by JEOL Ltd., JEE-4X Vacuum Evaporator). After that, the resultant was subjected to an oxidation treatment at 450° C. for 1 hour. Thus, an Al$_2$O$_3$ film was formed on the silicon substrate. An Fe thin film (having a thickness of 2 nm) was further deposited from the vapor onto the Al$_2$O$_3$ film with a sputtering apparatus (manufactured by ULVAC, Inc., RFS-200). Thus, a catalyst layer was formed.

Next, the silicon substrate with the catalyst layer was cut and mounted in a quartz tube having a diameter of 30 mm. A mixed gas of helium and hydrogen (120/80 sccm) with its moisture content kept at 330 ppm was flowed into the quartz tube for 30 minutes so that the air in the tube might be replaced. After that, the temperature in the tube was increased to 765° C. with an electric tubular furnace in 30 minutes in a stepwise fashion, and was then stabilized at 765° C. After the tube had been left to stand at 765° C. for 10 minutes, a mixed gas of helium, hydrogen, and ethylene (105/80/15 sccm, moisture content: 350 ppm) was filled into the tube while the temperature was retained. Then, the tube was left to stand for 60 minutes so that carbon nanotubes might be grown on the substrate. Thus, a carbon nanotube aggregate (5) was obtained.

The carbon nanotube aggregate (5) had a length of 1073 μm.

Figure 10:
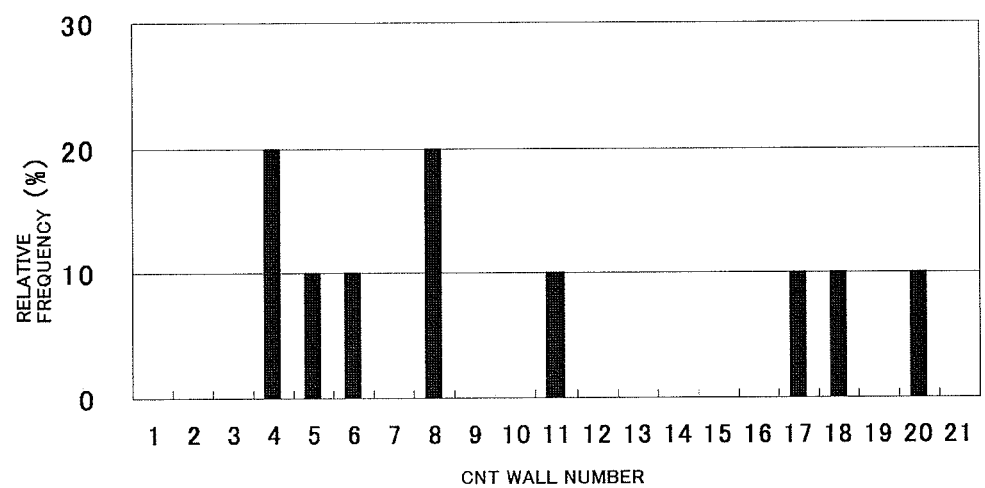
FIG. 10 is a view illustrating the wall number distribution of a carbon nanotube aggregate (5) obtained in Example 5.

FIG. 10 illustrates the wall number distribution of the carbon nanotube aggregate (5). As illustrated in FIG. 10, modes were present at 4 walls and 8 walls, and each had a relative frequency of 20%.

Table 3 summarizes the results.

(Measurement of Shear Adhesive Strength)

The carbon nanotubes (single-walled carbon nanotubes) provided for the above-mentioned carbon nanotube aggregate (5) were taken out with a spatula, and one end of each of the carbon nanotubes was crimped onto a glass (MATSUNAMI slide glass 27 mm×56 mm). Thus, the carbon nanotube aggregate (5) with a base material was obtained.

A shear adhesive strength was measured by using the carbon nanotube aggregate (5) with the base material as a sample (measurement method (A)). The shear adhesive strengths were 40.7 N/cm$^2$ at room temperature and 42.6 N/cm$^3$ at 250° C.

Table 3 summarizes the result.

Example 6

A carbon nanotube aggregate (6) was produced in the same manner as in Example 5 except that a mixed gas of helium, hydrogen, and ethylene (105/80/15 sccm, moisture content: 350 ppm) was filled into the quartz tube, and then the tube was left to stand for 20 minutes so that carbon nanotubes might be grown on the substrate.

The carbon nanotube aggregate (6) had a length of 357 μm.

Figure 11:
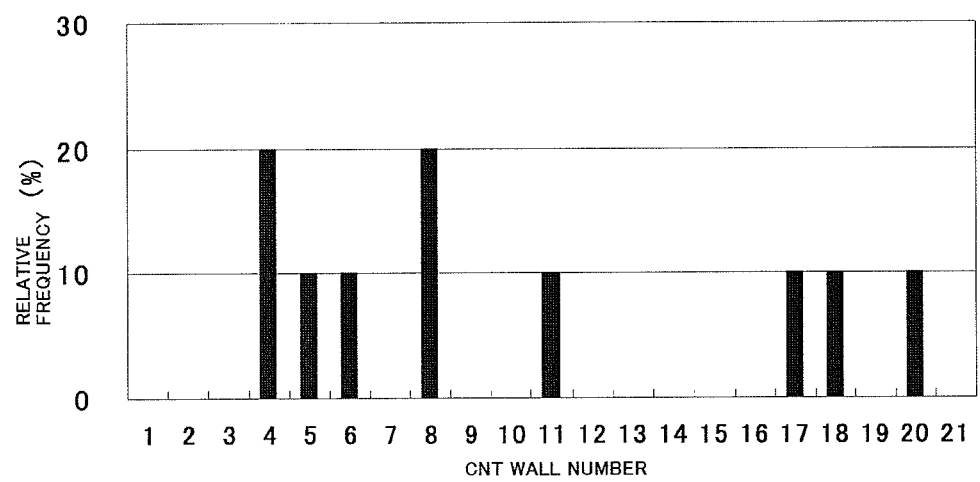
FIG. 11 is a view illustrating the wall number distribution of a carbon nanotube aggregate (6) obtained in Example 6.

FIG. 11 illustrates the wall number distribution of the carbon nanotube aggregate (6). As illustrated in FIG. 11, modes were present at 4 walls and 8 walls, and each had a relative frequency of 20%.

The carbon nanotube aggregate (6) with a base material was obtained in the same manner as in Example 5.

A shear adhesive strength was measured in the same manner as in Example 5 by using the carbon nanotube aggregate (6) with the base material as a sample (measurement method (A)). The shear adhesive strengths were 34.6 N/cm$^2$ at room temperature and 30.3 N/cm$^3$ at 250° C.

Table 3 summarizes the results.

Comparative Example 4

Shear adhesive strengths were each measured in the same manner as in Example 5 by using a general-purpose pressure-sensitive adhesive (manufactured by Nitto Denko Corporation, 31B) as a sample (measurement method (A)). The shear adhesive strengths were 65.3 N/cm$^2$ at room temperature and 33.2 N/cm$^2$ at 250° C.

Table 3 summarizes the results.

TABLE 3

| | Distribution width of wall number distribution | Mode of wall number distribution (relative frequency) | Length of carbon nanotube aggregate (μm) | Shear adhesive strength (N/cm²) | | |
| --- | --- | --- | --- | --- | --- | --- |
| | | | | Room temperature (A) | 250° C. (B) | B/A |
| Example 5 | 17 walls (4 to 20 walls) | 4 walls (20%) 8 walls (20%) | 1073 | 40.7 | 42.6 | 1.15 |
| Example 6 | 17 walls (4 to 20 walls) | 4 walls (20%) 8 walls (20%) | 357 | 34.6 | 30.3 | 0.86 |
| Comparative Example 4 | — | — | — | 65.3 | 33.2 | 0.51 |

In each of Examples 5 and 6, the shear adhesive strength for the glass surface under a 250° C. atmosphere was 0.8 to 1.2 times as high as the shear adhesive strength for the glass surface at room temperature. In contrast, in the case where a general-purpose pressure-sensitive adhesive was used like Comparative Example 4, the shear adhesive strength for the glass surface under a 250° C. atmosphere was less than 0.8 time as high as the shear adhesive strength for the glass surface at room temperature, and hence a significant reduction in adhesive strength was observed.

Example 7

A polypropylene resin (manufactured by KYOKUYO PULP & PAPER CO., LTD and having a thickness of 30 μm) was heated to 200° C. on a hot plate so as to melt. One end (upper end) of the carbon nanotube aggregate (5) formed on the substrate so as to be perpendicularly aligned obtained in Example 5 was crimped onto the molten polypropylene resin. After that, the carbon nanotube aggregate was fixed by cooling the resultant to room temperature. Thus, a carbon nanotube aggregate (5') with a base material was obtained.

Shear adhesive strengths were measured by using the carbon nanotube aggregate (5') with the base material as a sample (measurement method (B)). The shear adhesive strengths were as described below. A shear adhesive strength A for an adherend (glass) having a surface free energy of 64.4 mJ/m² was 43.4 N/cm² and a shear adhesive strength B for an adherend (PP plate) having a surface free energy of 29.8 mJ/m² was 38.7 N/cm².

Table 4 summarizes the results.

Example 8

A polypropylene resin (manufactured by KYOKUYO PULP & PAPER CO., LTD and having a thickness of 30 μm) was heated to 200° C. on a hot plate so as to melt. One end (upper end) of the carbon nanotube aggregate (6) formed on the substrate so as to be perpendicularly aligned obtained in Example 6 was crimped onto the molten polypropylene resin. After that, the carbon nanotube aggregate was fixed by cooling the resultant to room temperature. Thus, a carbon nanotube aggregate (6') with a base material was obtained.

Shear adhesive strengths were measured by using the carbon nanotube aggregate (6') with the base material as a sample (measurement method (B)). The shear adhesive strengths were as described below. A shear adhesive strength A for an adherend (glass) having a surface free energy of 64.4 mJ/m² was 36.5 N/cm² and a shear adhesive strength B for an adherend (PP plate) having a surface free energy of 29.8 mJ/m² was 40.7 N/cm².

Table 4 summarizes the results.

Comparative Example 5

Shear adhesive strengths were measured by using the general-purpose pressure-sensitive adhesive used in Comparative Example 4 (manufactured by Nitto Denko Corporation, 31B) as a sample (measurement method (B)). The shear adhesive strengths were as described below. A shear adhesive strength A for an adherend (glass) having a surface free energy of 64.4 mJ/m² was 65.0 N/cm² and a shear adhesive strength B for an adherend (PP plate) having a surface free energy of 29.8 mJ/m² was 37.0 N/cm².

Table 4 summarizes the results.

TABLE 4

| | Distribution width of wall number distribution | Mode of wall number distribution (relative frequency) | Length of carbon nanotube aggregate (μm) | Shear adhesive strength (N/cm²) | | |
| --- | --- | --- | --- | --- | --- | --- |
| | | | | Glass (A) | PP plate (B) | B/A |
| Example 7 | 17 walls (4 to 20 walls) | 4 walls (20%) 8 walls (20%) | 1073 | 43.4 | 38.7 | 0.89 |
| Example 8 | 17 walls (4 to 20 walls) | 4 walls (20%) 8 walls (20%) | 357 | 36.5 | 40.7 | 1.12 |
| Comparative Example 5 | — | — | — | 65.0 | 37.0 | 0.57 |

In each of Examples 7 and 8, when the shear adhesive strength at room temperature for the adherend (glass) having a surface free energy of 64.4 mJ/m² was represented by A and the shear adhesive strength at room temperature for the adherend (PP plate) having a surface free energy of 29.8 mJ/m² was represented by B, a value for a ratio B/A was 0.8 to 1.2. In contrast, in the case where a general-purpose pressure-sensitive adhesive was used like Comparative Example 5, when the shear adhesive strength at room temperature for the adherend (glass) having a surface free energy of 64.4 mJ/m² was represented by A and the shear adhesive strength at room temperature for the adherend (PP plate) having a surface free energy of 29.8 mJ/m² was represented by B, the value for the ratio B/A was less than 0.8, and hence a significant reduction in adhesive strength was observed.

Example 9

Production of Carbon Nanotube Aggregate

An Al thin film (having a thickness of 10 nm) was formed on a silicon substrate having an $SiO_2$ film on its surface (wafer with a thermal oxide film, manufactured by KST, $SiO_2$ film thickness=1 μm, the total thickness of the $SiO_2$ film and the silicon substrate=550 μm) with a vacuum evaporator (manufactured by JEOL Ltd., JEE-4X Vacuum Evaporator). After that, the resultant was subjected to an oxidation treatment at 450° C. for 1 hour. Thus, an $Al_2O_3$ film was formed on the silicon substrate. An Fe thin film (having a thickness of 2 nm) was further deposited from the vapor onto the $Al_2O_3$ film with a sputtering apparatus (manufactured by ULVAC, Inc., RFS-200). Thus, a catalyst layer was formed.

Next, the silicon substrate with the catalyst layer was cut and mounted in a quartz tube having a diameter of 30 mm. A mixed gas of helium and hydrogen (120/80 sccm) with its moisture content kept at 350 ppm was flowed into the quartz tube for 30 minutes so that the air in the tube might be replaced. After that, the temperature in the tube was increased to 765° C. with an electric tubular furnace in 30 minutes in a stepwise fashion, and was then stabilized at 765° C. After the tube had been left to stand at 765° C. for 10 minutes, a mixed gas of helium, hydrogen, and ethylene (105/80/15 sccm, moisture content: 350 ppm) was filled into the tube while the temperature was retained. Then, the tube was left to stand for 35 minutes so that carbon nanotubes might be grown on the substrate. Thus, a carbon nanotube aggregate (9) was obtained.

The carbon nanotube aggregate (9) had a length of 680 μm.
(Measurement of Shear Adhesive Strength)

A polypropylene resin (manufactured by KYOKUYO PULP & PAPER CO., LTD and having a thickness of 30 μm) was heated to 200° C. on a hot plate so as to melt. One end (upper end) of each of the carbon nanotubes formed on the above-mentioned substrate so as to be perpendicularly aligned was crimped onto the molten polypropylene resin. After that, the carbon nanotubes were fixed by cooling the resultant to room temperature. Thus, the carbon nanotube aggregate (9) with a base material was obtained.

A shear adhesive strength was measured by using the carbon nanotube aggregate (9) with the base material as a sample at 25° C. (measurement method (A)). The shear adhesive strength was 44.60 N/cm².
(Evaluation for Anti-Contamination Property)

The carbon nanotube aggregate (9) with the base material was crimped and bonded onto a semiconductor wafer having a diameter of 4 inches and a thickness of 500 μm in a class 10 clean room by reciprocating a 5-kg roller once. After a lapse of 1 hour, the aggregate was peeled at a 180° peel. The number of particle contaminants each having a size of 0.28 μm or more remaining on the peeled surface was measured with a laser surface-inspecting apparatus (LS-5000 manufactured by Hitachi Electronics Engineering Co., Ltd.). The number of particles each having a size of 0.28 μm or more remaining on the peeled semiconductor wafer was 22 particles/4-inch wafer.

It should be noted that the 180° peel in the above-mentioned evaluation for anti-contamination property was measured with a tension and compression tester ("TG-1kN" manufactured by Minebea Co., Ltd.) in conformity with the adhesion (180° peeling method) of JIS C 2107. It should be noted that a test piece was the carbon nanotube aggregate (9) with the base material, the crimping was performed by reciprocating the 5-kg roller once, and the measurement was performed at a temperature of 23±2° C., a humidity of 65±5% RH, and a peeling speed of 300 mm/min.
(Evaluation for Light-Peeling Property)

A 180° peel was measured as evaluation for light-peeling property. The 180° peel as the evaluation for light-peeling property was measured with a tension and compression tester ("TG-1kN" manufactured by Minebea Co., Ltd.) in conformity with the adhesion (180° peeling method) of JIS C 2107. It should be noted that a test piece was the carbon nanotube aggregate (9) with the base material having a width of 20 mm, a silicon wafer (bare wafer, P type, manufactured by KST) was used as a test panel, crimping was performed by reciprocating a 2-kg roller once, and the measurement was performed at a temperature of 23±2° C., a humidity of 65±5% RH, and a peeling speed of 300 mm/min. As a result of the measurement, the 180° peel was 0.95 N/20 mm.

INDUSTRIAL APPLICABILITY

The fibrous columnar structure aggregate of the present invention can be suitably used as a pressure-sensitive adhesive because the aggregate has excellent pressure-sensitive adhesive property. In addition, the aggregate can be used as, for example, a protective sheet at the time of the processing of a semiconductor wafer.

The invention claimed is:
1. The pressure-sensitive adhesive member, the pressure-sensitive adhesive member comprising a fibrous columnar structure aggregate as a carbon nanotube aggregate, the fibrous columnar structure aggregate comprising a plurality of fibrous columnar structures, wherein:
the fibrous columnar structures comprise carbon nanotubes, and the carbon nanotubes comprise carbon nanotubes each having a plurality of walls;
a difference between a maximum wall number and a minimum wall number of the wall numbers of the carbon nanotubes is 10 or more, and a relative frequency of a mode of the wall number distribution is 25% or less; and
a shear adhesive strength to a glass surface under a 250° C. atmosphere is 0.8 to 1.2 times as high as a shear adhesive strength to the glass surface at room temperature, and
wherein the fibrous columnar structure aggregate has a length of 300 μm to 2,000 μm and wherein a shear adhesive strength of the pressure-sensitive adhesive member to glass surface at room temperature is 15 N/cm² or more.
2. The pressure-sensitive adhesive member according to claim 1, wherein the carbon nanotubes each having the plurality of walls include carbon nanotubes each having a length of 300 μm to 2,000 μm.

3. The pressure-sensitive adhesive member according to claim 1, wherein the mode of the wall number distribution is present within a wall number range of 1 to 10.

4. The pressure-sensitive adhesive member according to claim 1, wherein the carbon nanotubes each having the plurality of walls are aligned in a lengthwise direction.

5. The pressure-sensitive adhesive member according to claim 1, further comprising a base material to which one end of each of the carbon nanotubes is fixed.

6. The pressure-sensitive adhesive member, the pressure-sensitive adhesive member comprising fibrous columnar structure aggregate as a carbon nanotube aggregate, the fibrous columnar structure aggregate comprising a plurality of fibrous columnar structures, wherein:
   the fibrous columnar structures comprise carbon nanotubes, and the carbon nanotubes comprise carbon nanotubes each having a plurality of walls;
   a difference between a maximum wall number and a minimum wall number of the wall numbers of the carbon nanotubes is 10 or more, and a relative frequency of a mode of the wall number distribution is 25% or less; and
   when a shear adhesive strength at room temperature for an adherend having a surface free energy a is represented by A and a shear adhesive strength at room temperature for an adherend having a surface free energy b differing from the surface free energy a by 25 mJ/m2 or more is represented by B provided that a>b, a value for a ratio B/A is 0.8 to 1.2, and
   wherein the fibrous columnar structure aggregate has a length of 300 μm to 2,000 μm and wherein a shear adhesive strength of the pressure-sensitive adhesive member to glass surface at room temperature is 15 N/cm$^2$ or more.

7. The pressure-sensitive adhesive member according to claim 6, wherein the carbon nanotubes each having the plurality of walls include carbon nanotubes each having a length of 300 μm to 2,000 μm.

8. The pressure-sensitive adhesive member according to claim 6, wherein the mode of the wall number distribution is present within a wall number range of 1 to 10.

9. The pressure-sensitive adhesive member according to claim 6, wherein the carbon nanotubes each having the plurality of walls are aligned in a lengthwise direction.

10. The pressure-sensitive adhesive member according to claim 6, further comprising a base material to which one end of each of the carbon nanotubes is fixed.

* * * * *